US012770823B2

(12) United States Patent
Doemer et al.

(10) Patent No.: US 12,770,823 B2
(45) Date of Patent: Oct. 20, 2026

(54) ABLATING MATERIAL FOR AN OBJECT IN A PARTICLE BEAM DEVICE

(71) Applicant: Carl Zeiss Microscopy GmbH, Jena (DE)

(72) Inventors: Holger Doemer, Bopfingen (DE); Michele Nicoletti, Munich (DE); Andreas Schmaunz, Oberkochen (DE)

(73) Assignee: Carl Zeiss Microscopy, GmbH, Jena (DE)

( * ) Notice: Subject to any disclaimer, the term of this patent is extended or adjusted under 35 U.S.C. 154(b) by 0 days.

(21) Appl. No.: 17/308,290

(22) Filed: May 5, 2021

(65) Prior Publication Data

US 2022/0130639 A1 Apr. 28, 2022

(30) Foreign Application Priority Data

May 6, 2020 (DE) ......................... 102020112220.9

(51) Int. Cl.

*H01J 37/305* (2006.01)
*C23C 14/22* (2006.01)
*C23C 14/28* (2006.01)
*C23C 14/30* (2006.01)
*C23C 14/34* (2006.01)
(Continued)

(52) U.S. Cl.

CPC ........ *H01J 37/3053* (2013.01); *C23C 14/221* (2013.01); *C23C 14/28* (2013.01); *C23C 14/30* (2013.01); *C23C 14/345* (2013.01); *C23C 14/46* (2013.01); *C23C 14/505* (2013.01);
(Continued)

(58) Field of Classification Search

CPC ........ H01J 37/3053; H01J 37/20; H01J 37/10; H01J 2237/006; H01J 2237/202; H01J 37/3056; H01J 2237/208; H01J 2237/31745; H01J 2237/31749; C23C 14/221; C23C 14/28; C23C 14/30; C23C 14/345; C23C 14/46; C23C 14/505;
(Continued)

(56) References Cited

U.S. PATENT DOCUMENTS 6,414,307 B1 * 7/2002 Gerlach ................ H01J 37/256
977/843
9,053,899 B2 * 6/2015 Sed'a .................. H01J 37/3005
(Continued)

FOREIGN PATENT DOCUMENTS

DE 699 09 967 T2 4/2004
DE 10 2007 054 073 A1 5/2009
(Continued)

*Primary Examiner* — Patrick S Ott

(74) *Attorney, Agent, or Firm* — Westborough IP Group, LLC

(57) ABSTRACT

Ablating a material from a material unit and arranging the material on an object in a particle beam apparatus includes feeding a particle beam with charged particles onto the material. The material is arranged on the material unit and/or the material unit is formed from the material. The material is ablatable from the material unit. The material is arranged on the material unit at a distance from the object. Ablating a material from a material unit and arranging the material on an object in a particle beam apparatus also includes ablating the ablatable material arranged on the material unit from the material unit using the particle beam, and arranging the ablated material on the object.

19 Claims, 10 Drawing Sheets

(51) Int. Cl.
*C23C 14/46* (2006.01)
*C23C 14/50* (2006.01)
*H01J 37/10* (2006.01)
*H01J 37/20* (2006.01)

(52) U.S. Cl.
CPC ............... *H01J 37/20* (2013.01); *H01J 37/10* (2013.01); *H01J 2237/006* (2013.01); *H01J 2237/202* (2013.01)

(58) Field of Classification Search
CPC ......... G01N 2223/072; G01N 23/2206; G01N 23/2251; G01N 23/2258
See application file for complete search history.

(56) References Cited

U.S. PATENT DOCUMENTS

| | | | | |
|---|---|---|---|---|
| 2004/0036031 | A1 | 2/2004 | Rose et al. | |
| 2004/0089821 | A1* | 5/2004 | Shichi | B23K 15/0013 250/442.11 |
| 2005/0184236 | A1* | 8/2005 | Baur | G01N 1/32 250/311 |
| 2008/0073587 | A1* | 3/2008 | Schmidt | B23K 15/0086 250/492.21 |
| 2009/0152459 | A1 | 6/2009 | Buhler et al. | |
| 2010/0055499 | A1* | 3/2010 | Harkness | C23C 14/024 428/800 |
| 2010/0181187 | A1* | 7/2010 | Krempel-Hesse | C23C 14/185 204/192.12 |
| 2011/0001058 | A1* | 1/2011 | Notte, IV | H01J 27/26 313/346 R |
| 2015/0114294 | A1 | 4/2015 | Bertagnolli et al. | |
| 2016/0118216 | A1* | 4/2016 | Doemer | H01J 37/28 250/307 |
| 2016/0141147 | A1* | 5/2016 | Brogden | H01J 37/3045 250/492.3 |
| 2016/0333464 | A1* | 11/2016 | Likhanskii | C23C 14/221 |
| 2017/0002467 | A1 | 1/2017 | Straw et al. | |

FOREIGN PATENT DOCUMENTS

| | | | |
|---|---|---|---|
| DE | 10 2013 104 086 | B3 | 10/2014 |
| DE | 10 2014 220 122 | A1 | 4/2016 |
| EP | 0 927 880 | A1 | 7/1999 |
| EP | 1 051 536 | B1 | 7/2003 |
| JP | 2002-313274 | A | 10/2022 |
| WO | WO 2002/067286 | A2 | 8/2002 |
| WO | WO 2007/082380 | A1 | 7/2007 |

* cited by examiner

ABLATING MATERIAL FOR AN OBJECT IN A PARTICLE BEAM DEVICE

CROSS-REFERENCE TO RELATED APPLICATIONS

This application claims the priority of the German patent application No. 10 2020 112 220.9, filed on May 6, 2020, which is incorporated herein by reference.

TECHNICAL FIELD

The system described herein relates to ablating at least one material from a material unit and for arranging the material on an object, the object being arranged in a particle beam apparatus. Further, the system described herein relates to a computer program product, and to a particle beam apparatus for ablating at least one material from a material unit and for arranging the material on an object. The particle beam apparatus is embodied as an electron beam apparatus and/or as an ion beam apparatus, for example.

BACKGROUND

Electron beam apparatuses, in particular a scanning electron microscope (also referred to as SEM) and/or a transmission electron microscope (also referred to as TEM), are used to examine objects (samples) in order to obtain knowledge with respect to the properties and the behavior under certain conditions.

In an SEM, an electron beam (also referred to as primary electron beam) is generated by means of a beam generator and focused onto an object to be examined by way of a beam-guiding system. The primary electron beam is guided in a raster manner over a surface of the object to be examined by way of a deflection device. Here, the electrons of the primary electron beam interact with the object to be examined. Interaction particles and/or interaction radiation are generated as a consequence of the interaction. As interaction particles, in particular, electrons, are emitted by the object (so-called secondary electrons) and electrons of the primary electron beam are backscattered (so-called backscattered electrons). The secondary electrons and backscattered electrons are detected and used for image generation. An imaging of the object to be examined is thus obtained. By way of example, x-ray radiation and/or cathodoluminescence is/are generated as interaction radiation. The interaction radiation is detected using a radiation detector, for example, and used for analyzing the object.

In the case of a TEM, a primary electron beam is likewise generated by means of a beam generator and directed onto an object to be examined by means of a beam-guiding system. The primary electron beam passes through the object to be examined. When the primary electron beam passes through the object to be examined, the electrons of the primary electron beam interact with the material of the object to be examined. The electrons passing through the object to be examined are imaged onto a luminescent screen or onto a detector (for example, a camera) by a system consisting of an objective and a projection unit. Here, imaging may also take place in the scanning mode of a TEM. Such a TEM is usually referred to as STEM. Additionally, provision can be made for detecting electrons backscattered at the object to be examined and/or secondary electrons emitted by the object to be examined by means of a further detector in order to image an object to be examined. Once again in turn, x-ray radiation and/or cathodoluminescence, for example, is/are generated. The interaction radiation is detected using a radiation detector, for example, and used for analyzing the object.

Furthermore, it is known from the prior art to use combination apparatuses for examining objects, wherein both electrons and ions can be guided to an object to be examined. By way of example, it is known to equip a SEM additionally with an ion beam column. An ion beam generator arranged in the ion beam column generates ions that are used for preparing an object (for example, removing material of the object or applying material to the object) or else for imaging (for example, by detecting secondary electrons generated). The SEM serves here in particular for observing the preparation, but also for further examination of the prepared or unprepared object. Applying material to the object is carried out, for example, using a gas feed. By way of example, a layer of the surface of the object is removed by means of the ion beam. After said layer has been removed, a further surface of the object is exposed. By means of a gas feed device, a gaseous precursor substance—a so-called precursor—can be admitted into the sample chamber. It is known to embody the gas feed device with an acicular and/or capillary-shaped device, which can be arranged quite close to a position of the object at a distance of a few micrometers (μm), such that the precursor can be guided to this position as accurately as possible and with a high concentration. As a result of the interaction of the ion beam with the precursor, a layer of a material is deposited on the surface of the object. By way of example, it is known for gaseous phenanthrene to be admitted as precursor into the sample chamber by means of the gas feed device. Essentially a layer of carbon or a carbon-containing layer then deposits on the surface of the object. It is also known to use a precursor comprising metal in order to deposit a metal or a metal-containing layer on the surface of the object.

The prior art has disclosed gas feed devices that comprise a precursor reservoir or a plurality of precursor reservoirs, wherein at least one precursor is held in each precursor reservoir. A precursor selected for a certain process—e.g., ablating or applying material from/to the object—is let out through an outlet of the precursor reservoir and guided to the object.

By way of example, the precursor is held as a solid or liquid pure substance in a known precursor reservoir. In order to bring the precursor into the gaseous phase, the precursor is evaporated within the precursor reservoir (transition from the liquid phase into the gaseous phase) or sublimated (direct transition from the solid phase into the gaseous phase). Subsequently, the precursor in the gaseous phase is conducted, for example, by at least one acicular capillary onto the object such that it can interact with the particle beam.

The prior art has disclosed the practice of fastening part of an object to a manipulator or to a sample carrier by depositing a material. To this end, the object is connected to the manipulator or the sample carrier. At a connection point between the object on the one hand and the manipulator or the sample carrier on the other hand material is deposited by feeding a precursor and a particle beam, in such a way that the object is securely connected to the manipulator or the sample carrier. If the part of the object is connected to the manipulator in this way, the part of the object can be taken with the manipulator from the object after the part of the object was separated from the object, for example, by using a particle beam.

As an alternative to fastening the part of the object to the manipulator by depositing a material, the practice of using a micro-gripper with a first clamping unit and with a second clamping unit as the manipulator is known. The part of the object is held in clamping fashion between the first clamping unit and the second clamping unit and lifted out of the object using the micro-gripper. However, the force exerted on the part of the object can affect the part of the object undesirably, up to the destruction of the part of the object.

As mentioned above, a layer of a material can be deposited on the surface of the object as a result of the interaction of an ion beam with a precursor. For some applications, it is advantageous if a pure material and/or a material with a very specific composition is/are deposited on the object, for example, to generate coatings that are highly electrically conductive. However, on account of residual gases present in the sample chamber there is contamination of the coating when such a coating is generated by the interaction of the ion beam with a precursor.

Moreover, the number of currently available precursors is limited, and so it is not possible to arbitrarily choose the material to be deposited. One is restricted to the available precursors and the material depositions obtainable therewith.

With regard to the prior art, reference is made to EP 0 927 880 A1, WO 2007/082380 A1 and DE 10 2014 220 122 A1.

SUMMARY OF THE INVENTION

The system described herein provides coatings made of pure materials and/or arbitrary materials with little contamination and which provide an alternative attachment of an object to a structural unit.

The method according to the system described herein serves for ablating at least one material and for arranging the material on an object, the object being arranged in a particle beam apparatus. The particle beam apparatus is designed for analysis, observation, and/or processing of the object. By way of example, the particle beam apparatus comprises at least one beam generator for generating a particle beam comprising charged particles. The charged particles are electrons or ions, for example. The particle beam apparatus comprises at least one objective lens for focusing the particle beam on the object and/or on a structural unit described in more detail elsewhere herein. Further, the particle beam apparatus comprises at least one detector for detecting interaction particles and/or interaction radiation which result/results from an interaction between the particle beam and the object when the particle beam is incident on the object.

In the method according to the system described herein, provision is made for the particle beam with the charged particles to be guided to the material, which is arranged on a material unit and/or from which the material unit is formed. By way of example, the particle beam is scanned over the surface of the material by means of a scanning device of the particle beam apparatus. Any unit that can be arranged in a sample chamber of a particle beam apparatus, for example, is suitable as a material unit. The physical configuration of the material unit is as desired. By way of example, the material unit can have a pointed, convex, concave, and/or flat embodiment. The material unit has a flat embodiment if a first side, for example, a longitudinal side, of an outer surface of the material unit is larger by a factor of ten, fifteen or twenty than a second side, for example, a transverse side, of the outer surface of the material unit. Explicit reference is made to the fact that the physical configuration of the material unit is not limited to the aforementioned embodiments. Rather, any configuration of the material unit which is suitable for the system described herein can be used. Further examples are explained elsewhere herein.

Further, provision is made in the method according to the system described herein for the material to be ablatable from the material unit. Expressed differently, the material can be removed, at least in part or else in full, from the material unit. Moreover, the material on the material unit is arranged at a distance from the object. Expressed differently, the material on the material unit is spaced apart from the object. In particular, provision is made for the material on the material unit and the object not to be in contact. Accordingly, the distance is not 0 μm but greater than 0 μm.

The method according to the system described herein further provides for the material to be ablated from the material unit using the particle beam. Expressed differently, there are interactions between the particle beam and the material when the particle beam is fed to the material, in such a way that the material is at least partly ablated from the material unit. This is also referred to as sputtering and/or evaporation. By way of example, an electron beam and/or an ion beam is/are used as particle beam.

Moreover, provision is made in the method according to the system described herein for the ablated material to now be arranged on the object. Expressed differently, the ablated material is deposited at a location on the surface of the object. A layer of the ablated material is formed there on the surface of the object. Accordingly, the ablated material from the material unit reaches the location of the object where the layer of the ablated material should be applied to the object. The closer the material unit is arranged to the object, the smaller the region of the surface of the object on which the ablated material is arranged. By way of example, the material unit has a distance of a few μm, for example, up to 20 μm, up to 10 μm, or up to 5 μm, from the location at which the ablated material is arranged on the surface of the object. This distance is sufficient so that material ablated from the material unit can be deposited at the location on the surface of the object.

Firstly, the method according to the system described herein allows coatings made of pure and/or arbitrary materials to be obtained. In principle, coatings on the surface of the object can be generated from all solids of the periodic table. Accordingly, the selection of materials that are able to be applied to the object is significantly larger than in the prior art.

Secondly, the method according to the system described herein provides an alternative attachment of an object firstly to a manipulator for holding and/or guiding the object and secondly to a sample carrier for holding the object.

The upshot of deliberations is that the system described herein is usable in cryo-electron microscopy, in particular. In cryo-electron microscopy, biological samples, in particular, are examined at cryogenic temperatures. Cryogenic temperatures are understood to mean temperatures of less than or equal to −100° C., for example. In particular, the temperature of liquid nitrogen or liquid helium is a cryogenic temperature.

The system described herein also facilitates an arrangement of a mixture of a plurality of materials and/or an arrangement of an alloy of a plurality of materials on the object. Moreover, the method according to the system described herein renders it possible to define, on the basis of the relative position of the material unit with respect to the object, the location on the surface of the object at which the material is arranged on the object. To this end, additional use can also be made of a mask and/or an aperture unit, for example, which are likewise used when defining the location on the surface of the object. Additionally, the location on the surface of the object where the material is arranged on the object can be defined by the choice of a certain physical configuration of the material unit.

In one embodiment of the method according to the system described herein, provision is additionally or alternatively made for the material unit to be moved relative to the object in such a way that the material unit is arranged at a distance from the object. To this end, use is made of a material unit movement device, for example, by means of which the material unit is moved. In addition or as an alternative thereto, a sample stage on which the object is arranged is moved.

In a further embodiment of the method according to the system described herein, provision is additionally or alternatively made for a first voltage to be applied between the material unit and the object for the purposes of arranging the ablated material on the object. This has the following background: When feeding the particle beam to the ablatable material on the material unit, at least some of the material ablated from the material unit is ionized. To be able to guide the ionized ablated material well in the direction of the object, the first voltage is applied between the material unit and the object. Then, the ionized ablated material is guided from the material unit to the object at the location on the surface of the object at which the ablated material is arranged. In yet a further embodiment of the method according to the system described herein, provision is additionally or alternatively made for at least one gas to be conducted using a gas supply unit to the location at which the particle beam strikes the material. By way of example, water vapor is used as a gas. As known from U.S. Pat. No. 6,414,307 B1, the entire content of which is incorporated by reference in this patent application, the supply of the gas increases the ionized proportion of the ablated material. This allows more ablated material to be guided from the material unit to the object on account of the applied voltage and to be arranged there at the location on the surface of the object. By way of example, provision is made in this embodiment for the material unit and the object not to be in contact and to accordingly be spaced apart. The fed gas can also have a further function. On account of the feed of the gas, e.g., nitrogen or an inert gas, the flow of the ionized material to the location on the surface of the object at which the ablated material is arranged is increased.

In one embodiment of the method according to the system described herein, provision is additionally or alternatively made for the material unit to comprise the ablatable material. By way of example, the material unit is formed from a different material to the ablatable material. Then, the ablatable material is arranged on the surface of the material unit, for example. In addition or as an alternative thereto, provision is made for the material unit to consist of the ablatable material. In a further embodiment of the method according to the system described herein, provision is additionally or alternatively made for the material initially to be applied to the material unit using the particle beam and a first gas feed device before the particle beam is fed to the material. By means of the gas feed device, a gaseous precursor substance—a precursor—can be admitted into the sample chamber of the particle beam apparatus. By way of example, the gas feed device comprises an acicular and/or capillary-shaped device, which can be arranged quite close to a position of the material unit at a distance of a few μm, for example, such that the precursor can be guided to this position as accurately as possible and with a sufficient concentration. As a result of the interaction of the particle beam, for example, an ion beam, with the precursor, a layer of the material is deposited on the surface of the material unit. In this way, the material unit is provided with the ablatable material which is then used in the further method according to the system described herein.

In addition or as an alternative thereto, the material is applied to the material unit by condensation, wherein the material unit is cooled and/or has been cooled. By way of example, the material unit is cooled to approximately −160° C. Subsequently, a precursor is fed to the material unit by means of the gas feed device. The precursor condenses on the cooled material unit and is deposited there.

In yet a further embodiment of the method according to the system described herein, provision is additionally or alternatively made for the ablated material to be arranged both on the object and on a structural unit of the particle beam apparatus. By way of example, the structural unit is embodied as the already aforementioned manipulator and/or as the already aforementioned sample carrier. In particular, provision is made in this embodiment of the method according to the system described herein for the ablated material to be arranged both on the object and on the structural unit of the particle beam apparatus, in such a way that the object is connected to the structural unit. In particular, provision is made for the object to be securely connected to the structural unit. This embodiment of the method according to the system described herein consequently provides an alternative attachment of the object to a structural unit of the particle beam apparatus in comparison with the prior art.

In one embodiment of the method according to the system described herein, provision is additionally or alternatively made for the structural unit to be moved relative to the object in such a way that the structural unit contacts the object or is arranged at a distance from the object. To this end, use is made of a structural unit movement device, for example, by means of which the structural unit is moved. In addition or as an alternative thereto, the sample stage on which the object is arranged is moved. If the structural unit contacts the object, then the ablated material is arranged at a connection point between firstly the object and secondly the structural unit, in such a way that the object is securely connected to the structural unit. If the structural unit is spaced apart from the object, the distance is chosen in such a way that the ablated material is arranged between the object and the structural unit in such a way that the object is securely connected to the structural unit.

In a further embodiment of the method according to the system described herein, provision is additionally or alternatively made for the structural unit to be embodied as the material unit. In particular, provision is made for the manipulator and/or the sample carrier to be embodied as the material unit. Consequently, the manipulator and/or the sample carrier have the ablatable material in this embodiment, which ablatable material is arranged at the object after ablation by the particle beam. In one embodiment of the method according to the system described herein, provision is additionally or alternatively made for the material initially to be applied to the structural unit using the particle beam and a second gas feed device before the particle beam is fed to the material. By way of example, the second gas feed device is also used as the first gas feed device. Accordingly, this embodiment provides for the use of only a single gas feed device. A precursor is admitted into the sample chamber of the particle beam apparatus by means of the second gas feed device. By way of example, the second gas feed device comprises an acicular and/or capillary-shaped device, which can be arranged quite close to a position of the structural unit at a distance of a few μm or which contacts the structural unit, such that the precursor can be guided to this position as accurately as possible and with a sufficient concentration. As a result of the interaction of the particle beam, for example, an ion beam, with the precursor, a layer of the material is deposited on the surface of the structural unit. In this way, the structural unit is provided with the ablatable material which is then used in the further method according to the system described herein.

In addition or as an alternative thereto, the material is applied to the material unit in the form of the structural unit by condensation, wherein the structural unit is cooled and/or has been cooled. By way of example, the structural unit is cooled to approximately −160° C. Subsequently, a precursor is fed to the structural unit by means of the second gas feed device. The precursor condenses on the cooled structural unit and is deposited there.

In yet a further embodiment of the method according to the system described herein, provision is additionally or alternatively made for a second voltage to be applied between the material unit and the structural unit for the purposes of arranging the ablated material on the structural unit. When feeding the particle beam to the material at least some of the ablated material is ionized. To be able to guide the ionized ablated material well in the direction of the structural unit, the second voltage is applied between the material unit and the structural unit. Then, the ionized ablated material is guided from the material unit to the structural unit at the location on the surface of the structural unit at which the material is arranged. In yet a further embodiment of the method according to the system described herein, provision is additionally or alternatively made for at least one second gas to be conducted using a second gas supply unit to the location at which the particle beam strikes the material. By way of example, water vapor is used as a gas. By way of example, the second gas supply unit is identical to the first gas supply unit. Consequently, only a single gas supply unit is used in the method according to the system described herein. As explained elsewhere herein, the supply of the second gas increases the proportion of the ionized ablated material. This allows more ablated material to be guided to the structural unit on account of the applied voltage and to be arranged there on the surface of the structural unit. In this embodiment, provision is made for the material unit and the structural unit not to be identical. Rather, the material unit and the structural unit are separate units.

The fed second gas can also have a further function. On account of the feed of the second gas, e.g., nitrogen or an inert gas, the flow of the ionized material to the location on the surface of the object at which the ablated material is arranged is increased.

In one embodiment of the method according to the system described herein, provision is additionally or alternatively made for the ablation of the material from the material unit to be examined and/or observed using a secondary ion mass spectrometer. By way of example, the examination of the ablation of the material can be implemented while the material is being ablated. In addition or as an alternative thereto, provision is made for the examination to be implemented after the material has been ablated, specifically by examining the surface of the material unit and/or the location on the object and/or the location on the structural unit at which the material is arranged, using the secondary ion mass spectrometer and/or, for example, by way of an analysis by means of x-ray radiation which arises during the interaction of the particle beam with the object.

In a further embodiment of the method according to the system described herein, provision is additionally or alternatively made for the material unit to have not only one ablatable material, the latter subsequently also being referred to as ablatable first material. Rather, the material unit also comprises an ablatable second material, which, for example, has a different embodiment from the ablatable first material. The ablatable second material is arranged at a distance from the object. Expressed differently, the ablatable second material is spaced apart from the object. In particular, provision is made for the ablatable second material on the material unit and the object not to be in contact. Accordingly, the distance is not 0 μm but greater than 0 μm. In this embodiment of the method according to the system described herein, provision is made for the particle beam with the charged particles to be guided to the ablatable second material. By way of example, the particle beam is scanned over the surface of the ablatable second material on the material unit by means of the scanning device of the particle beam apparatus. Here, the ablatable second material is ablated at least in part or else in full from the material unit. Expressed differently, there are interactions when the particle beam is fed to the second material, in such a way that the ablatable second material is ablated at least in part or else in full from the material unit. By way of example, an electron beam and/or an ion beam is used as particle beam. Moreover, provision is made in this embodiment of the method according to the system described herein for the ablated second material to now be arranged on the object. In this respect, the ablated second material is deposited at a location on the object. By way of example, this location is identical to the location on the surface of the object at which the ablated first material is arranged. A layer of the ablated second material is formed there on the surface of the object. Accordingly, the ablated second material from the material unit reaches the location of the object where the layer of the ablated second material should be applied to the object. The closer the material unit is arranged to the object, the smaller the region of the surface of the object on which the ablated second material is arranged. By way of example, the material unit has a distance of a few μm, for example, up to 20 μm, up to 10 μm, or up to 5 μm, from the location at which the ablated second material is arranged on the surface of the object. This distance is sufficient so that second material ablated from the material unit can be deposited at the location on the surface of the object.

In an even further embodiment of the method according to the system described herein, provision is additionally or alternatively made for the ablated second material to be arranged both on the object and on the structural unit of the particle beam apparatus. In particular, provision is made in this embodiment of the method according to the system described herein for the ablated second material to be arranged both on the object and on the structural unit of the particle beam apparatus, in such a way that the object is connected to the structural unit. In particular, provision is made for the object to be securely connected to the structural unit. This embodiment of the method according to the system described herein consequently also provides an alternative attachment of the object to a structural unit of the particle beam apparatus in comparison with the prior art.

In yet a further embodiment of the method according to the system described herein, provision is additionally or alternatively made for the particle beam to be guided to the ablatable first material in a first position of the material unit, for the material unit to be moved by the material unit movement device from the first position into a second position, and for the particle beam to be guided to the ablatable second material in the second position of the material unit. In particular, provision is made in a further embodiment of the method according to the system described herein for the material unit to be rotated from the first position to the second position by way of the material unit movement device. However, the invention is not restricted to a rotation from the first position to the second position. Rather, any movement, in particular any translational movement, which moves the material unit from the first position to the second position is suitable and usable for the system described herein.

In one embodiment of the method according to the system described herein, provision is additionally or alternatively made for the material unit to comprise a first material device and a second material device. This first material device and/or this second material device are now used in this embodiment of the method according to the system described herein. The first material device comprises the ablatable first material. By contrast, the second material device comprises the ablatable second material. The first material device is spatially separated from the second material device. In a further embodiment of the method according to the system described herein, provision is additionally or alternatively made for the first material device to be completely spatially separated from the second material device. Accordingly, the first material device and the second material device are not in contact. The distance between the first material device and the second material device is greater than 0 μm. The upshot of deliberations is that, in this embodiment, the feed of the ablated first material and the ablated second material to the object and/or to the structural unit and the arrangement of the ablated first material and the ablated second material on the object and/or on the structural unit will be implemented particularly well. As an alternative thereto, provision is made for the first material device and the second material device to be in contact with one another.

The system described herein also relates to a computer program product comprising a program code, which is loadable or loaded into a processor, wherein the program code, when executed in the processor, controls the particle beam apparatus in such a way that a method having at least one of the aforementioned or following features or having a combination of at least two of the aforementioned or following features is carried out.

The system described herein further relates to a particle beam apparatus for analyzing, observing, and/or processing an object. The particle beam apparatus according to the system described herein is designed to carry out a method having at least one of the aforementioned or following features or having a combination of at least two of the aforementioned or following features. The particle beam apparatus according to the system described herein comprises at least one beam generator for generating a particle beam comprising charged particles. The charged particles are electrons or ions, for example. The particle beam apparatus comprises at least one objective lens for focusing the particle beam on the object and/or on a structural unit that is described elsewhere herein. Further, the particle beam apparatus comprises at least one detector for detecting interaction particles and/or interaction radiation which result/results from an interaction between the particle beam and the object when the particle beam is incident on the object. Further, the particle beam apparatus according to the system described herein is provided with at least one structural unit in the form of a manipulator and/or in the form of a sample carrier. By way of example, the manipulator is designed to hold and/or move the object and/or a part of the object. By way of example, the sample carrier is designed to hold the object and/or a part of the object. Moreover, the particle beam apparatus according to the system described herein comprises at least one material unit which comprises at least one ablatable material, wherein the ablatable material is arranged at a distance from the object. In this respect, reference is made to the explanations provided elsewhere herein, which also apply in this case. Moreover, provision is made in particular for the particle beam apparatus according to the system described herein to comprise a processor, in which a computer program product is loaded, the computer program product having at least one of the aforementioned or following features or having a combination of at least two of the aforementioned or following features.

In one embodiment of the particle beam apparatus according to the system described herein, provision is additionally or alternatively made for the structural unit to be embodied as the material unit. As an alternative thereto, provision is made for the structural unit and the material unit to be units that differ from one another. In particular, provision is made for the structural unit and the material unit to be arranged spatially separated from one another in the particle beam apparatus when the method according to the system described herein is carried out.

In a further embodiment of the particle beam apparatus according to the system described herein, provision is made, additionally or alternatively, for the particle beam apparatus to have at least one of the following features:

- at least one structural unit movement device for moving the structural unit;
- at least one material unit movement device for moving the material unit;
- at least one sample stage for moving the object;
- at least one first voltage supply unit for applying a voltage between the material unit and the object;
- at least one second voltage supply unit for applying a voltage between the material unit and the structural unit;
- at least one secondary ion mass spectrometer for examining an ablation of the ablatable material from the material unit.

In an even further embodiment of the particle beam apparatus according to the system described herein, provision is additionally or alternatively made for the particle beam apparatus to have the following features:

- the ablatable material of the material unit is an ablatable first material,
- the material unit comprises at least one ablatable second material, and
- the ablatable second material is arranged at a distance from the object.

In yet a further embodiment of the particle beam apparatus according to the system described herein, provision is additionally or alternatively made for the particle beam apparatus to have the following features:

- the material unit comprises a first material device and a second material device,
- the first material device comprises the ablatable first material,
- the second material device comprises the ablatable second material, and
- the first material device and the second material device are units that are separated from one another. As an alternative thereto, provision is made for the first material device and the second material device to be in contact with one another.

In a further embodiment of the particle beam apparatus according to the system described herein, the beam generator is embodied as a first beam generator and the particle beam is embodied as a first particle beam comprising first charged particles. Further, the objective lens is embodied as a first objective lens for focusing the first particle beam on the object. Moreover, the particle beam apparatus according to the system described herein comprises at least one second beam generator for generating a second particle beam comprising second charged particles. Further, the particle beam apparatus according to the system described herein comprises at least one second objective lens for focusing the second particle beam on the object.

In particular, provision is made for the particle beam apparatus to be embodied as an electron beam apparatus and/or as an ion beam apparatus.

BRIEF DESCRIPTION OF DRAWINGS

Further practical embodiments and advantages of the system described herein are described below in association with the drawings. In the figures.

DESCRIPTION OF VARIOUS EMBODIMENTS

The system described herein is now explained in more detail by means of particle beam apparatuses in the form of an SEM and in the form of a combination apparatus, which has an electron beam column and an ion beam column. Reference is explicitly made to the fact that the system described herein may be used in any particle beam apparatus, in particular in any electron beam apparatus and/or any ion beam apparatus.

Figure 1:
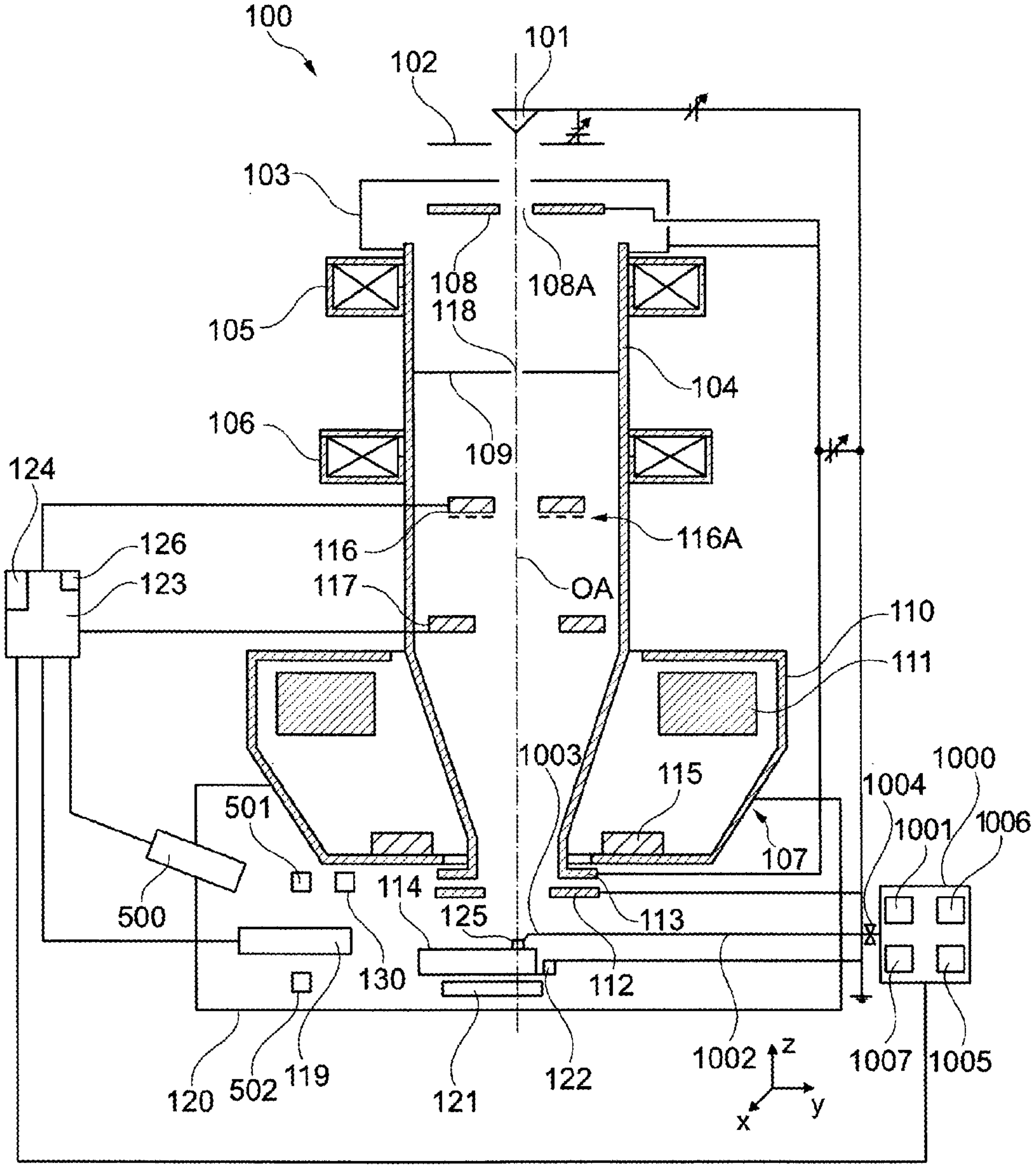
FIG. 1 shows a first embodiment of a particle beam apparatus.

FIG. 1 shows a schematic illustration of an SEM 100. The SEM 100 comprises a first beam generator in the form of an electron source 101, which is embodied as a cathode. Further, the SEM 100 is provided with an extraction electrode 102 and with an anode 103, which is placed onto one end of a beam-guiding tube 104 of the SEM 100. By way of example, the electron source 101 is embodied as a thermal field emitter. However, the invention is not restricted to such an electron source 101. Rather, any electron source is utilizable.

Electrons emerging from the electron source 101 form a primary electron beam. The electrons are accelerated to the anode potential on account of a potential difference between the electron source 101 and the anode 103. In the embodiment illustrated here, the anode potential is 100 V to 35 kV, e.g. 5 kV to 15 kV, in particular 8 kV, relative to a ground potential of a housing of a sample chamber 120. However, alternatively it could also be at ground potential.

Two condenser lenses, specifically a first condenser lens 105 and a second condenser lens 106, are arranged at the beam-guiding tube 104. Here, proceeding from the electron source 101 as viewed in the direction of a first objective lens 107, the first condenser lens 105 is arranged first, followed by the second condenser lens 106. Reference is explicitly made to the fact that further embodiments of the SEM 100 may have only a single condenser lens. A first aperture unit 108 is arranged between the anode 103 and the first condenser lens 105. Together with the anode 103 and the beam-guiding tube 104, the first aperture unit 108 is at a high voltage potential, specifically the potential of the anode 103, or connected to ground. The first aperture unit 108 has numerous first apertures 108A, of which one is illustrated in FIG. 1. By way of example, two first apertures 108A are present. Each one of the numerous first apertures 108A has a different aperture diameter. By means of an adjustment mechanism (not illustrated), it is possible to set a desired first aperture 108A onto an optical axis OA of the SEM 100. Reference is explicitly made to the fact that, in further embodiments, the first aperture unit 108 may be provided with only a single aperture 108A. In this embodiment, an adjustment mechanism may be absent. The first aperture unit 108 is then designed to be stationary. A stationary second aperture unit 109 is arranged between the first condenser lens 105 and the second condenser lens 106. As an alternative thereto, provision is made for the second aperture unit 109 to be embodied in a movable fashion.

The first objective lens 107 has pole pieces 110, in which a hole is formed. The beam-guiding tube 104 is guided through this hole. A coil 111 is arranged in the pole pieces 110.

An electrostatic retardation device is arranged in a lower region of the beam-guiding tube 104. This comprises an individual electrode 112 and a tube electrode 113. The tube electrode 113 is arranged at one end of the beam-guiding tube 104, the end facing an object 125 that is arranged on an object holder 114 embodied in a movable fashion.

Together with the beam-guiding tube 104, the tube electrode 113 is at the potential of the anode 103, while the individual electrode 112 and the object 125 are at a lower potential in relation to the potential of the anode 103. In the present case, this is the ground potential of the housing of the sample chamber 120. In this manner, the electrons of the primary electron beam may be decelerated to a desired energy which is required for examining the object 125.

The SEM 100 further comprises a scanning device 115, by means of which the primary electron beam may be deflected and scanned over the object 125. Here, the electrons of the primary electron beam interact with the object 125. As a result of the interaction, interaction particles arise, which are detected. In particular, electrons are emitted from the surface of the object 125—so-called secondary electrons—or electrons of the primary electron beam are backscattered—so-called backscattered electrons—as interaction particles.

The object 125 and the individual electrode 112 may also be at different potentials and potentials different than ground. It is thereby possible to set the location of the retardation of the primary electron beam in relation to the object 125. By way of example, if the retardation is carried out quite close to the object 125, imaging aberrations become smaller.

A detector arrangement comprising a first detector 116 and a second detector 117 is arranged in the beam-guiding tube 104 for detecting the secondary electrons and/or the backscattered electrons. Here, the first detector 116 is arranged on the source-side along the optical axis OA, while the second detector 117 is arranged on the object-side along the optical axis OA in the beam-guiding tube 104. The first detector 116 and the second detector 117 are arranged offset from one another in the direction of the optical axis OA of the SEM 100. Both the first detector 116 and the second detector 117 each have a passage opening, through which the primary electron beam may pass. The first detector 116 and the second detector 117 are approximately at the potential of the anode 103 and of the beam-guiding tube 104. The optical axis OA of the SEM 100 extends through the respective passage openings.

The second detector 117 serves principally for detecting secondary electrons. Upon emerging from the object 125, the secondary electrons initially have a low kinetic energy and arbitrary directions of motion. By means of the strong extraction field emanating from the tube electrode 113, the secondary electrons are accelerated in the direction of the first objective lens 107. The secondary electrons enter the first objective lens 107 approximately parallel. The beam diameter of the beam of the secondary electrons remains small in the first objective lens 107 as well. The first objective lens 107 then has a strong effect on the secondary electrons and generates a comparatively short focus of the secondary electrons with sufficiently steep angles with respect to the optical axis OA, such that the secondary electrons diverge far apart from one another downstream of the focus and strike the second detector 117 on the active area thereof. By contrast, only a small proportion of electrons that are backscattered at the object 125—that is to say backscattered electrons which have a relatively high kinetic energy in comparison with the secondary electrons upon emerging from the object 125—are detected by the second detector 117. The high kinetic energy and the angles of the backscattered electrons with respect to the optical axis OA upon emerging from the object 125 have the effect that a beam waist, that is to say a beam region having a minimum diameter, of the backscattered electrons lies in the vicinity of the second detector 117. A large portion of the backscattered electrons passes through the passage opening of the second detector 117. Therefore, the first detector 116 substantially serves to detect the backscattered electrons.

In a further embodiment of the SEM 100, the first detector 116 may additionally be embodied with an opposing field grid 116A. The opposing field grid 116A is arranged at the side of the first detector 116 directed toward the object 125. With respect to the potential of the beam-guiding tube 104, the opposing field grid 116A has a negative potential such that only backscattered electrons with a high energy pass through the opposing field grid 116A to the first detector 116. In addition or as an alternative thereto, the second detector 117 has a further opposing field grid, which has an analogous embodiment to the aforementioned opposing field grid 116A of the first detector 116 and which has an analogous function.

The detection signals generated by the first detector 116 and the second detector 117 are used to generate an image or images of the surface of the object 125.

Reference is explicitly made to the fact that the apertures of the first aperture unit 108 and of the second aperture unit 109, as well as the passage openings of the first detector 116 and of the second detector 117, are illustrated in exaggerated fashion. The passage openings of the first detector 116 and of the second detector 117 have an extent perpendicular to the optical axis OA in the range of 0.5 mm to 5 mm. By way of example, they are of circular design and have a diameter in the range of 1 mm to 3 mm perpendicular to the optical axis OA.

The second aperture unit 109 is configured as a pinhole stop in the embodiment illustrated here and is provided with a second aperture 118 for the passage of the primary electron beam, which second aperture has an extent in the range from 5 μm to 500 μm, e.g. 35 μm. As an alternative thereto, provision is made in a further embodiment for the second aperture unit 109 to be provided with a plurality of apertures, which can be displaced mechanically with respect to the primary electron beam or which can be reached by the primary electron beam by the use of electrical and/or magnetic deflection elements. The second aperture unit 109 is embodied as a pressure stage aperture unit. This separates a first region, in which the electron source 101 is arranged and in which an ultra-high vacuum ($10^{-7}$ hPa to $10^{-12}$ hPa) prevails, from a second region, which has a high vacuum ($10^{-3}$ hPa to $10^{-7}$ hPa). The second region is the intermediate pressure region of the beam-guiding tube 104, which leads to the sample chamber 120.

The sample chamber 120 is under vacuum. For the purposes of generating the vacuum, a pump (not illustrated) is arranged at the sample chamber 120. In the embodiment illustrated in FIG. 1, the sample chamber 120 is operated in a first pressure range or in a second pressure range. The first pressure range comprises only pressures of less than or equal to $10^{-3}$ hPa, and the second pressure range comprises only pressures of greater than $10^{-3}$ hPa. To ensure said pressure ranges, the sample chamber 120 is vacuum-sealed.

The object holder 114 is arranged at a sample stage 122. The sample stage 122 is embodied to be movable in three directions arranged perpendicular to one another, specifically in an x-direction (first stage axis), in a y-direction (second stage axis) and in a z-direction (third stage axis).

Moreover, the sample stage 122 can be rotated about two rotation axes which are arranged perpendicular to one another (stage rotation axes). The invention is not restricted to the sample stage 122 described elsewhere herein. Rather, the sample stage 122 can have further translation axes and rotation axes along which or about which the sample stage 122 can move.

The SEM 100 further comprises a third detector 121, which is arranged in the sample chamber 120. More precisely, the third detector 121 is arranged downstream of the sample stage 122, viewed from the electron source 101 along the optical axis OA. The sample stage 122, and hence the object holder 114, can be rotated in such a way that the primary electron beam can radiate through the object 125 arranged on the object holder 114. When the primary electron beam passes through the object 125 to be examined, the electrons of the primary electron beam interact with the material of the object 125 to be examined. The electrons passing through the object 125 to be examined are detected by the third detector 121.

Arranged in the sample chamber 120 is a radiation detector 119, which is used to detect interaction radiation, for example, x-ray radiation and/or cathodoluminescence. The radiation detector 119, the first detector 116, and the second detector 117 are connected to a control unit 123, which comprises a monitor 124. The third detector 121 is also connected to the control unit 123. This is not illustrated for reasons of clarity. In addition or as an alternative thereto, a further detector in the form of a chamber detector 130, in particular for detecting secondary electrons, can be arranged in the sample chamber 120. The latter is likewise connected to the control unit 123 (not illustrated). The control unit 123 processes detection signals that are generated by the first detector 116, the second detector 117, the third detector 121, the radiation detector 119, and/or the chamber detector 130 and displays said detection signals in the form of images on the monitor 124.

Moreover, the SEM 100 comprises a secondary ion mass spectrometer 500, which is connected to the control unit 123.

The control unit 123 furthermore has a database 126, in which data are stored and from which data are read out.

The SEM 100 comprises a gas feed device 1000, which carries out the tasks of both the gas feed devices, which is explained elsewhere herein, and the gas supply units, which is also explained elsewhere herein. Firstly, the gas feed device 1000 serves to feed a gaseous precursor to a specific position on the surface of the object 125 or a unit of the SEM 100 that is explained elsewhere herein. The gas feed device 1000 comprises a precursor reservoir 1001. By way of example, the precursor is held as a solid or liquid pure substance in the precursor reservoir 1001. In order to bring the precursor into the gaseous phase, the precursor is evaporated or sublimated within the precursor reservoir 1001. By way of example, this process can be influenced by controlling the temperature of the precursor reservoir 1001 and/or of the precursor. As an alternative thereto, the precursor is held in the precursor reservoir 1001 as a gaseous pure substance. By way of example, phenanthrene is used as precursor. Essentially a layer of carbon or a carbon-containing layer then deposits on the surface of the object 125. As an alternative thereto, by way of example, a precursor comprising metal can be used to deposit a metal or a metal-containing layer on the surface of the object 125. By way of example, it is also possible to deposit a non-conductive material, in particular $SiO_2$, on the surface of the object 125. Furthermore, provision is also made for the precursor to be used for removing material of the object 125 upon interaction with a particle beam.

The gas feed device 1000 is provided with a feed line 1002. The feed line 1002 has, in the direction of the object 125, an acicular and/or a capillary-shaped device, for example, in the form of a hollow tube 1003, which in particular is able to be brought into the vicinity of the surface of the object 125, for example, at a distance of 10 μm to 1 mm from the surface of the object 125. The hollow tube 1003 has a feed opening, the diameter of which is, for example, in the range of 10 μm to 1000 μm, in particular in the range of 100 μm to 600 μm. The feed line 1002 has a valve 1004 in order to regulate the flow rate of gaseous precursor into the feed line 1002. Expressed differently, when the valve 1004 is opened, gaseous precursor from the precursor reservoir 1001 is introduced into the feed line 1002 and conducted via the hollow tube 1003 to the surface of the object 125. When the valve 1004 is closed, the flow of the gaseous precursor onto the surface of the object 125 is stopped.

The gas feed device 1000 is furthermore provided with an adjusting unit 1005, which enables an adjustment of the position of the hollow tube 1003 in all 3 spatial directions—namely an x-direction, a y-direction and a z-direction—and an adjustment of the orientation of the hollow tube 1003 by means of a rotation and/or a tilting. The gas feed device 1000 and thus also the adjusting unit 1005 are connected to the control unit 123 of the SEM 100.

In further embodiments, the precursor reservoir 1001 is not arranged directly at the gas feed device 1000. Rather, in the further embodiments, provision is made for the precursor reservoir 1001 to be arranged, for example, at a wall of a room in which the SEM 100 is situated. As an alternative thereto, provision is made for the precursor reservoir 1001 to be arranged in a first room and for the SEM 100 to be arranged in a second room that is separate from the first room. In yet a further alternative in this respect, provision is made for the precursor reservoir 1001 to be arranged in a cupboard device.

The gas feed device 1000 comprises a temperature measuring unit 1006. By way of example, a resistance measuring device, a thermocouple, and/or a semiconductor temperature sensor is used as temperature measuring unit 1006. However, the invention is not restricted to the use of such temperature measuring units. Rather, any suitable temperature measuring unit which is suitable for the system described herein can be used as temperature measuring unit. In particular, provision can be made for the temperature measuring unit not to be arranged at the gas feed device 1000 itself, but rather to be arranged, for example, at a distance from the gas feed device 1000.

The gas feed device 1000 further comprises a temperature setting unit 1007. By way of example, the temperature setting unit 1007 is a heating device, in particular, a conventional infrared heating device, a heating wire, and/or a Peltier element. As an alternative thereto, the temperature setting unit 1007 is embodied as a heating and/or cooling device, which comprises a heating wire, for example. However, the invention is not restricted to the use of such a temperature setting unit 1007. Rather, any suitable temperature setting unit can be used.

The SEM 100 also comprises an adjustable structural unit 501, which is only illustrated schematically in FIG. 1. By way of example, the structural unit 501 is embodied as a manipulator and/or as a sample carrier. By way of example, the manipulator is designed to hold and/or move the object 125. By way of example, the sample carrier is designed to hold the object 125. In particular, the sample carrier is embodied as a TEM sample carrier.

Moreover, the SEM 100 also comprises an adjustable material unit 502, which is only illustrated schematically in FIG. 1. The adjustable material unit 502 is discussed in more detail elsewhere herein.

Figure 2:
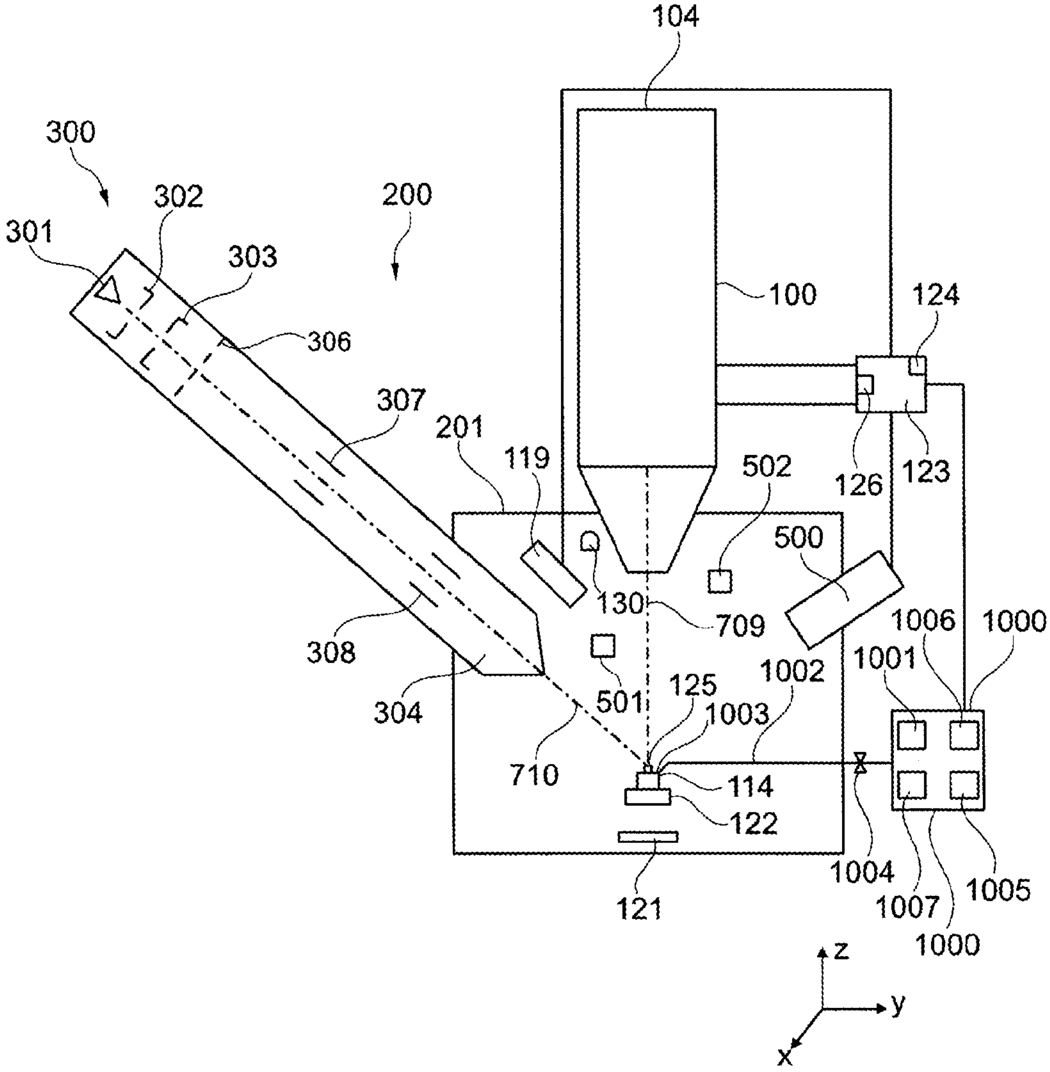
FIG. 2 shows a second embodiment of a particle beam apparatus.

FIG. 2 shows a particle beam apparatus in the form of a combination apparatus 200. The combination apparatus 200 has two particle beam columns. Firstly, the combination apparatus 200 is provided with the SEM 100, as already illustrated in FIG. 1, but without the sample chamber 120. Rather, the SEM 100 is arranged at a sample chamber 201. The sample chamber 201 is under vacuum. For the purposes of generating the vacuum, a pump (not illustrated) is arranged at the sample chamber 201. In the embodiment illustrated in FIG. 2, the sample chamber 201 is operated in a first pressure range or in a second pressure range. The first pressure range comprises only pressures of less than or equal to $10^{-3}$ hPa, and the second pressure range comprises only pressures of greater than $10^{-3}$ hPa. To ensure said pressure ranges, the sample chamber 201 is vacuum-sealed.

The third detector 121 is arranged in the sample chamber 201.

The SEM 100 serves to generate a first particle beam, specifically the primary electron beam described elsewhere herein, and has the optical axis, specified elsewhere herein, which is provided with the reference sign 709 in FIG. 2 and which is also referred to as the first beam axis. Secondly, the combination apparatus 200 is provided with an ion beam apparatus 300, which is likewise arranged at the sample chamber 201. The ion beam apparatus 300 likewise has an optical axis, which is provided with the reference sign 710 in FIG. 2 and which is also referred to as the second beam axis.

The SEM 100 is arranged vertically in relation to the sample chamber 201. By contrast, the ion beam apparatus 300 is arranged in a manner inclined by an angle of approximately 0° to 90° in relation to the SEM 100. An arrangement of approximately 50° is illustrated by way of example in FIG. 2. The ion beam apparatus 300 comprises a second beam generator in the form of an ion beam generator 301. Ions, which form a second particle beam in the form of an ion beam, are generated by the ion beam generator 301. The ions are accelerated by means of an extraction electrode 302, which is at a predeterminable potential. The second particle beam then passes through an ion optical unit of the ion beam apparatus 300, wherein the ion optical unit comprises a condenser lens 303 and a second objective lens 304. The second objective lens 304 ultimately generates an ion probe, which is focused onto the object 125 arranged at an object holder 114. The object holder 114 is arranged at a sample stage 122.

An adjustable or selectable aperture unit 306, a first electrode arrangement 307 and a second electrode arrangement 308 are arranged above the second objective lens 304 (i.e., in the direction of the ion beam generator 301), wherein the first electrode arrangement 307 and the second electrode arrangement 308 are embodied as scanning electrodes. The second particle beam is scanned over the surface of the object 125 by means of the first electrode arrangement 307 and the second electrode arrangement 308, with the first electrode arrangement 307 acting in a first direction and the second electrode arrangement 308 acting in a second direction, which is counter to the first direction. Thus, scanning is carried out in a first direction, for example. The scanning in a second direction perpendicular thereto is brought about by further electrodes (not illustrated), which are rotated by 90°, at the first electrode arrangement 307 and at the second electrode arrangement 308.

As explained elsewhere herein, the object holder 114 is arranged at the sample stage 122. In the embodiment shown in FIG. 2, too, the sample stage 122 is embodied to be movable in three directions arranged perpendicular to one another, specifically in an x-direction (first stage axis), in a y-direction (second stage axis) and in a z-direction (third stage axis). Moreover, the sample stage 122 can be rotated about two rotation axes which are arranged perpendicular to one another (stage rotation axes).

The distances illustrated in FIG. 2 between the individual units of the combination apparatus 200 are illustrated in exaggerated fashion in order to better illustrate the individual units of the combination apparatus 200.

Arranged in the sample chamber 201 is a radiation detector 119, which is used to detect interaction radiation, for example, x-ray radiation and/or cathodoluminescence. The radiation detector 119 is connected to a control unit 123, which has a monitor 124. In addition or as an alternative thereto, a further detector in the form of a chamber detector 130, in particular for detecting secondary electrons, can be arranged in the sample chamber 201. The latter is likewise connected to the control unit 123 (not illustrated).

The control unit 123 processes detection signals that are generated by the first detector 116, the second detector 117 (not illustrated in FIG. 2), the third detector 121, the radiation detector 119, and/or the chamber detector 130 and displays said detection signals in the form of images on the monitor 124.

The control unit 123 furthermore has a database 126, in which data are stored and from which data are read out.

The combination apparatus 200 comprises a gas feed device 1000, which carries out the tasks of both the gas feed devices, which is explained elsewhere herein, and the gas supply units, which is explained elsewhere herein. Firstly, the gas feed device 1000 serves to feed a gaseous precursor to a specific position on the surface of the object 125 or a unit of the combination apparatus 200 that is explained further elsewhere herein. The gas feed device 1000 comprises a precursor reservoir 1001. By way of example, the precursor is held as a solid or liquid pure substance in the precursor reservoir 1001. In order to bring the precursor into the gaseous phase, the precursor is evaporated or sublimated within the precursor reservoir 1001. By way of example, this process can be influenced by controlling the temperature of the precursor reservoir 1001 and/or of the precursor. As an alternative thereto, the precursor is held in the precursor reservoir 1001 as a gaseous pure substance. By way of example, phenanthrene is used as precursor. Essentially a layer of carbon or a carbon-containing layer is then deposited on the surface of the object 125. As an alternative thereto, by way of example, a precursor comprising metal can be used to deposit a metal or a metal-containing layer on the surface of the object 125. By way of example, it is also possible to deposit a non-conductive metal, in particular $SiO_2$, on the surface of the object 125. Furthermore, provision is also made for the precursor to be used for removing material of the object 125 upon interaction with the particle beam.

The gas feed device 1000 is provided with a feed line 1002. The feed line 1002 has, in the direction of the object 125, an acicular and/or a capillary-shaped device, for example, in the form of a hollow tube 1003, which in particular is able to be brought into the vicinity of the surface of the object 125, for example, at a distance of 10 μm to 1 mm from the surface of the object 125. The hollow tube 1003 has a feed opening, the diameter of which is, for example, in the range of 10 μm to 1000 μm, in particular in the range of 100 μm to 600 μm. The feed line 1002 has a valve 1004 in order to regulate the flow rate of gaseous precursor into the feed line 1002. Expressed differently, when the valve 1004 is opened, gaseous precursor from the precursor reservoir 1001 is introduced into the feed line 1002 and conducted via the hollow tube 1003 to the surface of the object 125. When the valve 1004 is closed, the flow of the gaseous precursor onto the surface of the object 125 is stopped.

The gas feed device 1000 is furthermore provided with an adjusting unit 1005, which enables an adjustment of the position of the hollow tube 1003 in all 3 spatial directions—namely an x-direction, a y-direction and a z-direction—and an adjustment of the orientation of the hollow tube 1003 by means of a rotation and/or a tilting. The gas feed device 1000 and thus also the adjusting unit 1005 are connected to the control unit 123 of the SEM 100.

In further embodiments, the precursor reservoir 1001 is not arranged directly at the gas feed device 1000. Rather, in the further embodiments, provision is made for the precursor reservoir 1001 to be arranged, for example, at a wall of a room in which the combination apparatus 200 is situated. As an alternative thereto, provision is made for the precursor reservoir 1001 to be arranged in a first room and for the combination apparatus 200 to be arranged in a second room that is separate from the first room. In yet a further alternative in this respect, provision is made for the precursor reservoir to be arranged in a cupboard device.

The gas feed device 1000 comprises a temperature measuring unit 1006. By way of example, a resistance measuring device, a thermocouple, and/or a semiconductor temperature sensor is used as a temperature measuring unit 1006. However, the invention is not restricted to the use of such temperature measuring units. Rather, any suitable temperature measuring unit which is suitable for the system described herein can be used as temperature measuring unit. In particular, provision can be made for the temperature measuring unit not to be arranged at the gas feed device 1000 itself, but rather to be arranged, for example, at a distance from the gas feed device 1000.

The gas feed device 1000 further comprises a temperature setting unit 1007. By way of example, the temperature setting unit 1007 is a heating device, in particular a conventional infrared heating device, a heating wire, and/or a Peltier element. As an alternative thereto, the temperature setting unit 1007 is embodied as a heating and/or cooling device, which comprises a heating wire, for example. However, the invention is not restricted to the use of such a temperature setting unit 1007. Rather, any suitable temperature setting unit can be used.

The combination apparatus 200 also comprises an adjustable structural unit 501, which is only illustrated schematically in FIG. 2. By way of example, the structural unit 501 is embodied as a manipulator and/or as a sample carrier. By way of example, the manipulator is designed to hold and/or move the object 125. By way of example, the sample carrier is designed to hold the object 125. In particular, the sample carrier is embodied as a TEM sample carrier.

Moreover, the combination apparatus 200 also comprises an adjustable material unit 502, which is only illustrated schematically in FIG. 2. The adjustable material unit 502 is discussed in more detail elsewhere herein.

Figure 3:
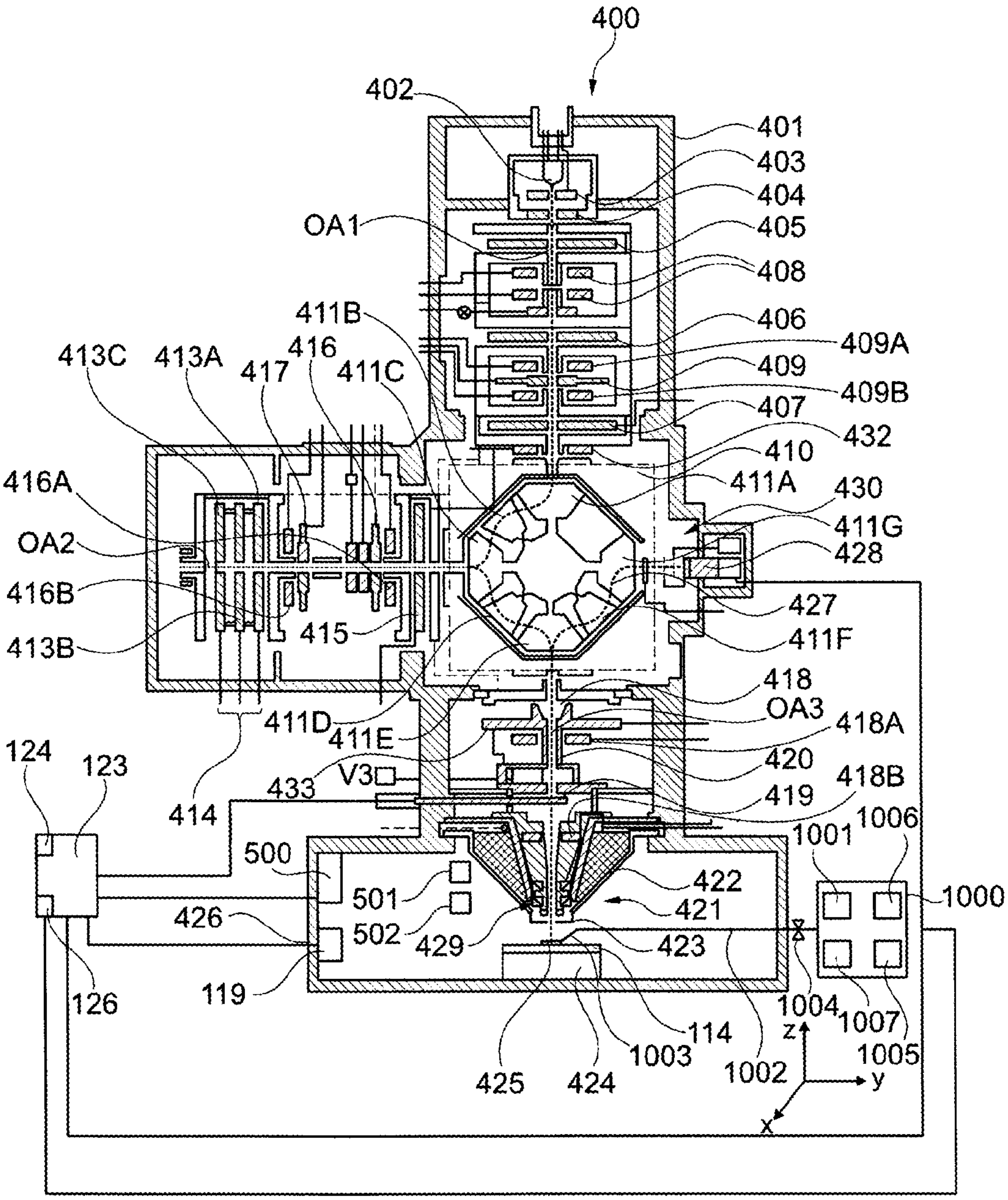
FIG. 3 shows a third embodiment of a particle beam apparatus.

FIG. 3 is a schematic illustration of a further embodiment of a particle beam apparatus according to the system described herein. This embodiment of the particle beam apparatus is provided with the reference sign 400 and comprises a mirror corrector for correcting, for example, chromatic and/or spherical aberrations. The particle beam apparatus 400 comprises a particle beam column 401, which is embodied as an electron beam column and which substantially corresponds to an electron beam column of a corrected SEM. However, the particle beam apparatus 400 is not restricted to an SEM with a mirror corrector. Rather, the particle beam apparatus may comprise any type of corrector units.

The particle beam column 401 comprises a particle beam generator in the form of an electron source 402 (cathode), an extraction electrode 403, and an anode 404. By way of example, the electron source 402 is embodied as a thermal field emitter. Electrons emerging from the electron source 402 are accelerated to the anode 404 on account of a potential difference between the electron source 402 and the anode 404. Accordingly, a particle beam in the form of an electron beam is formed along a first optical axis OA1.

The particle beam is guided along a beam path, which corresponds to the first optical axis OA1, after the particle beam has emerged from the electron source 402. A first electrostatic lens 405, a second electrostatic lens 406, and a third electrostatic lens 407 are used to guide the particle beam.

Furthermore, the particle beam is set along the beam path using a beam-guiding device. The beam-guiding device of this embodiment comprises a source setting unit with two magnetic deflection units 408 arranged along the first optical axis OA1. Moreover, the particle beam apparatus 400 comprises electrostatic beam deflection units. A first electrostatic beam deflection unit 409, which is also embodied as a quadrupole in a further embodiment, is arranged between the second electrostatic lens 406 and the third electrostatic lens 407. The first electrostatic beam deflection unit 409 is likewise arranged downstream of the magnetic deflection units 408. A first multi-pole unit 409A in the form of a first magnetic deflection unit is arranged at one side of the first electrostatic beam deflection unit 409. Moreover, a second multi-pole unit 409B in the form of a second magnetic deflection unit is arranged at the other side of the first electrostatic beam deflection unit 409. The first electrostatic beam deflection unit 409, the first multi-pole unit 409A, and the second multi-pole unit 409B are set for the purposes of setting the particle beam in respect of the axis of the third electrostatic lens 407 and the entrance window of a beam deflection device 410. The first electrostatic beam deflection unit 409, the first multi-pole unit 409A and the second multi-pole unit 409B may interact like a Wien filter. A further magnetic deflection element 432 is arranged at the entrance to the beam deflection device 410.

The beam deflection device 410 is used as a particle beam deflector, which deflects the particle beam in a specific manner. The beam deflection device 410 comprises a plurality of magnetic sectors, specifically a first magnetic sector 411A, a second magnetic sector 411B, a third magnetic sector 411C, a fourth magnetic sector 411D, a fifth magnetic sector 411E, a sixth magnetic sector 411F, and a seventh magnetic sector 411G. The particle beam enters the beam deflection device 410 along the first optical axis OA1 and the particle beam is deflected by the beam deflection device 410 in the direction of a second optical axis OA2. The beam deflection is performed by means of the first magnetic sector 411A, by means of the second magnetic sector 411B and by means of the third magnetic sector 411C through an angle of 30° to 120°. The second optical axis OA2 is oriented at the same angle with respect to the first optical axis OA1. The beam deflection device 410 also deflects the particle beam which is guided along the second optical axis OA2, to be precise in the direction of a third optical axis OA3. The beam deflection is provided by the third magnetic sector 411C, the fourth magnetic sector 411D, and the fifth magnetic sector 411E. In the embodiment in FIG. 3, the deflection with respect to the second optical axis OA2 and with respect to the third optical axis OA3 is provided by deflection of the particle beam at an angle of 90°. Hence, the third optical axis OA3 extends coaxially with respect to the first optical axis OA1. However, reference is made to the fact that the particle beam apparatus 400 according to the system described herein is not restricted to deflection angles of 90°. Rather, any suitable deflection angle may be selected by the beam deflection device 410, for example, 70° or 110°, such that the first optical axis OA1 does not extend coaxially with respect to the third optical axis OA3. In respect of further details of the beam deflection device 410, reference is made to WO 2002/067286 A2, which is incorporated by reference herein.

After the particle beam has been deflected by the first magnetic sector 411A, the second magnetic sector 411B, and the third magnetic sector 411C, the particle beam is guided along the second optical axis OA2. The particle beam is guided to an electrostatic mirror 414 and travels on its path to the electrostatic mirror 414 along a fourth electrostatic lens 415, a third multi-pole unit 416A in the form of a magnetic deflection unit, a second electrostatic beam deflection unit 416, a third electrostatic beam deflection unit 417, and a fourth multi-pole unit 416B in the form of a magnetic deflection unit. The electrostatic mirror 414 comprises a first mirror electrode 413A, a second mirror electrode 413B, and a third mirror electrode 413C. Electrons of the particle beam which are reflected back at the electrostatic mirror 414 once again travel along the second optical axis OA2 and re-enter the beam deflection device 410. Then, they are deflected to the third optical axis OA3 by the third magnetic sector 411C, the fourth magnetic sector 411D, and the fifth magnetic sector 411E.

The electrons of the particle beam emerge from the beam deflection device 410 and are guided along the third optical axis OA3 to an object 425 that is intended to be examined and is arranged in an object holder 114. On the path to the object 425, the particle beam is guided to a fifth electrostatic lens 418, a beam-guiding tube 420, a fifth multi-pole unit 418A, a sixth multi-pole unit 418B, and an objective lens 421. The fifth electrostatic lens 418 is an electrostatic immersion lens. By way of the fifth electrostatic lens 418, the particle beam is decelerated or accelerated to an electric potential of the beam-guiding tube 420.

By means of the objective lens 421, the particle beam is focused into a focal plane in which the object 425 is arranged. The object holder 114 is arranged at a movable sample stage 424. The movable sample stage 424 is arranged in a sample chamber 426 of the particle beam apparatus 400. The sample stage 424 is embodied to be movable in three directions arranged perpendicular to one another, specifically in an x-direction (first stage axis), in a y-direction (second stage axis) and in a z-direction (third stage axis). Moreover, the sample stage 424 can be rotated about two rotation axes which are arranged perpendicular to one another (stage rotation axes).

The sample chamber 426 is under vacuum. For the purposes of generating the vacuum, a pump (not illustrated) is arranged at the sample chamber 426. In the embodiment illustrated in FIG. 3, the sample chamber 426 is operated in a first pressure range or in a second pressure range. The first pressure range comprises only pressures of less than or equal to $10^{-3}$ hPa, and the second pressure range comprises only pressures of greater than $10^{-3}$ hPa. To ensure said pressure ranges, the sample chamber 426 is vacuum-sealed.

The objective lens 421 may be embodied as a combination of a magnetic lens 422 and a sixth electrostatic lens 423. The end of the beam-guiding tube 420 may further be an electrode of an electrostatic lens. After emerging from the beam-guiding tube 420, particles of the particle beam apparatus are decelerated to a potential of the object 425. The objective lens 421 is not restricted to a combination of the magnetic lens 422 and the sixth electrostatic lens 423. Rather, the objective lens 421 may assume any suitable form. By way of example, the objective lens 421 may also be embodied as a purely magnetic lens or as a purely electrostatic lens.

The particle beam which is focused onto the object 425 interacts with the object 425. Interaction particles are generated. In particular, secondary electrons are emitted from the object 425 or backscattered electrons are backscattered at the object 425. The secondary electrons or the backscattered electrons are accelerated again and guided into the beam-guiding tube 420 along the third optical axis OA3. In particular, the trajectories of the secondary electrons and the backscattered electrons extend on the route of the beam path of the particle beam in the opposite direction to the particle beam.

The particle beam apparatus 400 comprises a first analysis detector 419, which is arranged between the beam deflection device 410 and the objective lens 421 along the beam path. Secondary electrons traveling in directions oriented at a large angle with respect to the third optical axis OA3 are detected by the first analysis detector 419.

Backscattered electrons and secondary electrons which have a small axial distance with respect to the third optical axis OA3 at the location of the first analysis detector 419—i.e., backscattered electrons and secondary electrons which have a small distance from the third optical axis OA3 at the location of the first analysis detector 419—enter the beam deflection device 410 and are deflected to a second analysis detector 428 by the fifth magnetic sector 411E, the sixth magnetic sector 411F and the seventh magnetic sector 411G along a detection beam path 427. By way of example, the deflection angle is 90° or 110°.

The first analysis detector 419 generates detection signals which are largely generated by emitted secondary electrons. The detection signals which are generated by the first analysis detector 419 are guided to a control unit 123 and are used to obtain information about the properties of the interaction region of the focused particle beam with the object 425. In particular, the focused particle beam is scanned over the object 425 using a scanning device 429. By means of the detection signals generated by the first analysis detector 419, an image of the scanned region of the object 425 can then be generated and displayed on a display unit. The display unit is, for example, a monitor 124 that is arranged at the control unit 123.

The second analysis detector 428 is also connected to the control unit 123. Detection signals of the second analysis detector 428 are passed to the control unit 123 and used to generate an image of the scanned region of the object 425 and to display the image on a display unit. The display unit is, for example, the monitor 124 that is arranged at the control unit 123.

Arranged at the sample chamber 426 is a radiation detector 119, which is used to detect interaction radiation, for example, x-ray radiation and/or cathodoluminescence. The radiation detector 119 is connected to the control unit 123, which has the monitor 124. The control unit 123 processes detection signals of the radiation detector 119 and displays the detection signals in the form of images on the monitor 124.

The control unit 123 furthermore has a database 126, in which data are stored and from which data are read out.

Moreover, the particle beam apparatus 400 comprises a secondary ion mass spectrometer 500, which is connected to the control unit 123.

The particle beam apparatus 400 comprises a gas feed device 1000, which carries out the tasks of both the gas feed devices, which is explained elsewhere herein, and the gas supply units, which is explained elsewhere herein. Firstly, the gas feed device 1000 serves to feed a gaseous precursor to a specific position on the surface of the object 425 or a unit of the particle beam apparatus 400 that is explained further elsewhere herein. The gas feed device 1000 comprises a precursor reservoir 1001. By way of example, the precursor is held as a solid or liquid pure substance in the precursor reservoir 1001. In order to bring the precursor into the gaseous phase, the precursor is evaporated or sublimated within the precursor reservoir 1001. By way of example, this process can be influenced by controlling the temperature of the precursor reservoir 1001 and/or of the precursor. As an alternative thereto, the precursor is held in the precursor reservoir 1001 as a gaseous pure substance. By way of example, phenanthrene is used as precursor. Essentially a layer of carbon or a carbon-containing layer is then deposited on the surface of the object 425. As an alternative thereto, by way of example, a precursor comprising metal can be used to deposit a metal or a metal-containing layer on the surface of the object 425. By way of example, it is also possible to deposit a non-conductive material, in particular $SiO_2$, on the surface of the object 425. Furthermore, provision is also made for the precursor to be used for removing material of the object 425 upon interaction with the particle beam.

The gas feed device 1000 is provided with a feed line 1002. The feed line 1002 has, in the direction of the object 425, an acicular and/or a capillary-shaped device, for example, in the form of a hollow tube 1003, which in particular is able to be brought into the vicinity of the surface of the object 425, for example, at a distance of 10 μm to 1 mm from the surface of the object 425. The hollow tube 1003 has a feed opening, the diameter of which is, for example, in the range of 10 μm to 1000 μm, in particular in the range of 100 μm to 600 μm. The feed line 1002 has a valve 1004 in order to regulate the flow rate of gaseous precursor into the feed line 1002. Expressed differently, when the valve 1004 is opened, gaseous precursor from the precursor reservoir 1001 is introduced into the feed line 1002 and conducted via the hollow tube 1003 to the surface of the object 425. When the valve 1004 is closed, the flow of the gaseous precursor onto the surface of the object 425 is stopped.

The gas feed device 1000 is furthermore provided with an adjusting unit 1005, which enables an adjustment of the position of the hollow tube 1003 in all 3 spatial directions—namely an x-direction, a y-direction and a z-direction—and an adjustment of the orientation of the hollow tube 1003 by means of a rotation and/or a tilting. The gas feed device 1000 and thus also the adjusting unit 1005 are connected to the control unit 123 of the particle beam apparatus 400.

In further embodiments, the precursor reservoir 1001 is not arranged directly at the gas feed device 1000. Rather, in the further embodiments, provision is made for the precursor reservoir 1001 to be arranged, for example, at a wall of a room in which the particle beam apparatus 400 is situated. As an alternative thereto, provision is made for the precursor reservoir 1001 to be arranged in a first room and for the particle beam apparatus 400 to be arranged in a second room that is separate from the first room. In yet a further alternative in this respect, provision is made for the precursor reservoir 1001 to be arranged in a cupboard device.

The gas feed device 1000 comprises a temperature measuring unit 1006. By way of example, a resistance measuring device, a thermocouple, and/or a semiconductor temperature sensor is used as temperature measuring unit 1006. However, the invention is not restricted to the use of such temperature measuring units. Rather, any suitable temperature measuring unit which is suitable for the system described herein can be used as temperature measuring unit. In particular, provision can be made for the temperature measuring unit not to be arranged at the gas feed device 1000 itself, but rather to be arranged, for example, at a distance from the gas feed device 1000.

The gas feed device 1000 further comprises a temperature setting unit 1007. By way of example, the temperature setting unit 1007 is a heating device, in particular a conventional infrared heating device, a heating wire, and/or a Peltier element. As an alternative thereto, the temperature setting unit 1007 is embodied as a heating and/or cooling device, which comprises a heating wire, for example. However, the invention is not restricted to the use of such a temperature setting unit 1007. Rather, any suitable temperature setting unit can be used.

The particle beam apparatus 400 also comprises an adjustable structural unit 501, which is only illustrated schematically in FIG. 3. By way of example, the structural unit 501 is embodied as a manipulator and/or as a sample carrier. By way of example, the manipulator is designed to hold and/or move the object 125. By way of example, the sample carrier is designed to hold the object 125. In particular, the sample carrier is embodied as a TEM sample carrier.

Moreover, the particle beam apparatus 400 also comprises an adjustable material unit 502, which is only illustrated schematically in FIG. 3. The adjustable material unit 502 is discussed in more detail elsewhere herein.

Figure 4:
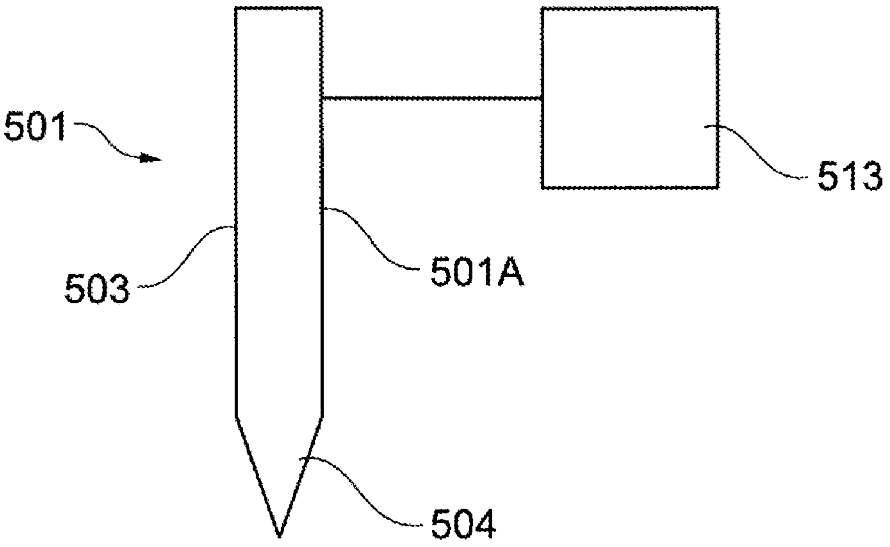
FIG. 4 shows a schematic illustration of a structural unit in the form of a manipulator.

FIG. 4 shows a schematic illustration of an embodiment of the structural unit 501, which is used, for example, in the SEM 100 as per FIG. 1, in the combination apparatus 200 as per FIG. 2, and in the particle beam apparatus 400 as per FIG. 3. The structural unit 501 is embodied as a manipulator 501A. The manipulator 501A is designed to hold at least a part of the object 125, 425, for guiding and/or for moving the part of the object 125, 425. The manipulator 501A comprises a main body 503. One end of the main body 503 is provided with a tip 504. As explained in more detail elsewhere herein, the object 125, 425 and/or a part of the object 125, 425 can be fastened to the tip 504 of the manipulator 501A, for example. The manipulator 501A is arranged on a structural unit movement device 513. The structural unit movement device 513 provides a movement of the manipulator 501A. Using the structural unit movement device 513 the manipulator 501A is movable in three directions arranged perpendicular to one another, namely in an x-direction, in a y-direction and in a z-direction. Moreover, the manipulator 501A can be rotated about two rotation axes which are arranged perpendicular to one another. The invention is not restricted to the movements of the manipulator 501A described herein. Rather, the manipulator 501A can have further translation axes and rotation axes along which or about which the manipulator 501A can move.

Figure 5:
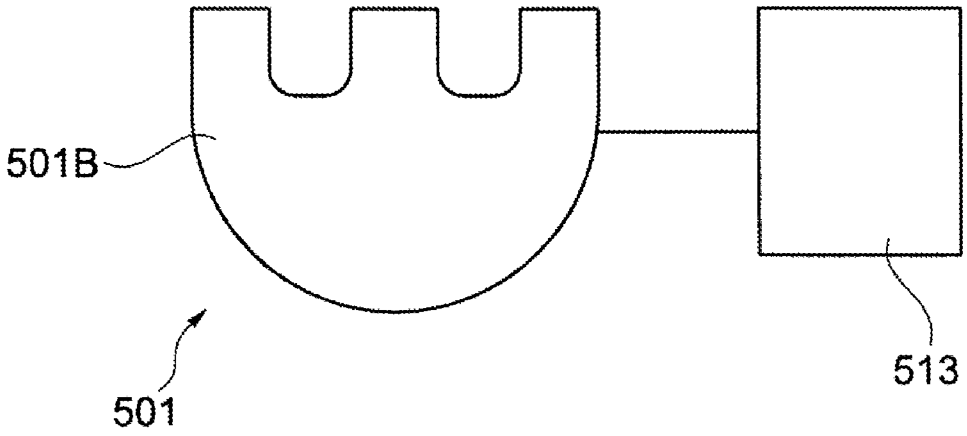
FIG. 5 shows a schematic illustration of a structural unit in the form of a sample carrier.

FIG. 5 shows a schematic illustration of a further embodiment of the structural unit 501, which is used, for example, in the SEM 100 as per FIG. 1, in the combination apparatus 200 as per FIG. 2, and in the particle beam apparatus 400 as per FIG. 3. The structural unit 501 as per FIG. 5 is embodied as a sample carrier 501B. By way of example, the sample carrier 501B is a TEM sample carrier which, for example, has the rounded form with three protruding fingers illustrated in FIG. 5. By way of example, a part of the object 125, 425 is fastened to the protruding fingers and subsequently processed and/or examined by means of a particle beam. The sample carrier 501B is arranged on the structural unit movement device 513. The structural unit movement device 513 provides a movement of the sample carrier 501B. Using the structural unit movement device 513 the sample carrier 501B is movable in three directions arranged perpendicular to one another, namely in an x-direction, in a y-direction and in a z-direction. Moreover, the sample carrier 501B can be rotated about two rotation axes which are arranged perpendicular to one another. The invention is not restricted to the movements of the sample carrier 501B described herein. Rather, the sample carrier 501B can have further translation axes and rotation axes along which or about which the sample carrier 501B can move.

FIGS. 6 to 9 show schematic illustrations of embodiments of the material unit 502, which are used, for example, in the SEM 100 as per FIG. 1, in the combination apparatus 200 as per FIG. 2, and in the particle beam apparatus 400 as per FIG. 3.

Figure 6:
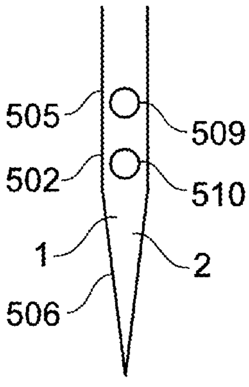
FIG. 6 shows a first embodiment of a material unit.

FIG. 6 shows a first embodiment of the material unit 502. The material unit 502 comprises a main body 505 and an end 506 adjoining the main body 505. The end 506 is embodied with a point in this embodiment.

Figure 7:
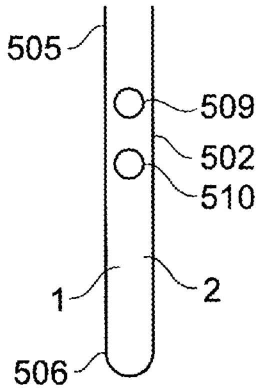
FIG. 7 shows a second embodiment of a material unit.

FIG. 7 shows a second embodiment of the material unit 502. The material unit 502 comprises a main body 505 and an end 506 adjoining the main body 505. The end 506 is embodied to be convex in this embodiment.

Figure 8:
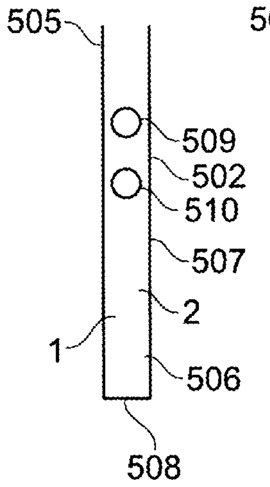
FIG. 8 shows a third embodiment of a material unit.

FIG. 8 shows a third embodiment of the material unit 502. The material unit 502 comprises a main body 505 and an end 506 adjoining the main body 505. The end 506 is embodied to be flat in this embodiment. A first side in the form of a longitudinal side 507 of the material unit 502 is larger by a factor of ten, fifteen or twenty than a second side in the form of a transverse side 508 of the material unit 502.

Figure 9:
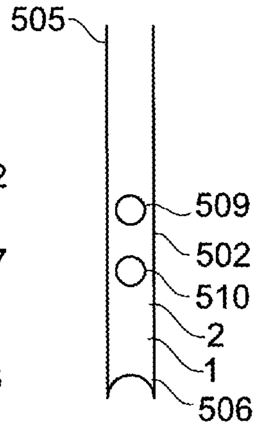
FIG. 9 shows a fourth embodiment of a material unit.

FIG. 9 shows a fourth embodiment of the material unit 502. The material unit 502 comprises a main body 505 and an end 506 adjoining the main body 505. The end 506 is embodied to be concave in this embodiment.

Reference is made to the fact that the invention is not restricted to the embodiments of the material unit 502 as per FIGS. 6 to 9 described here. Rather, the material unit 502 can have any form that is suitable for the system described herein.

By way of example, the material unit 502 consists of an ablatable material 1, in particular copper. In a further embodiment, provision is made for the material unit 502 to consist of a plurality of ablatable materials, for example, an ablatable first material 1 and an ablatable second material 2. By way of example, the material unit 502 consists of a mixture of the ablatable first material 1 and the ablatable second material 2. In addition or as an alternative thereto, the material unit 502 consists of an alloy. By way of example, the material unit 502 has a first side consisting of the first material 1 and a second side consisting of the second material 2.

In a further embodiment, the material unit 502 comprises the ablatable material 1 and is itself formed from a material that differs from the ablatable material 1. Then, the ablatable material 1 is arranged on the surface of the material unit 502, for example. This is illustrated schematically in FIGS. 6 to 9. By way of example, a first location 509 at which the ablatable first material 1 is arranged is arranged on the surface of each material unit 502 in these embodiments. Additionally or alternatively, a second location 510 at which the ablatable second material 2 is arranged is arranged on the surface of each material unit 502.

Figure 10:
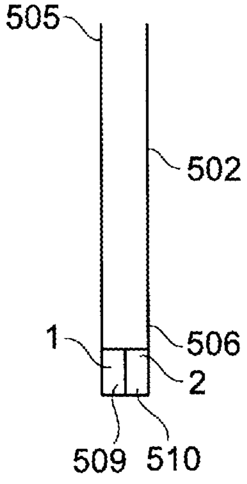
FIG. 10 shows a fifth embodiment of a material unit.

FIG. 10 shows a fifth embodiment of the material unit 502. The fifth embodiment is based on the third embodiment of FIG. 8. The same reference signs denote identical components. In contrast to the third embodiment of FIG. 8, the end 506 of the material unit 502 of FIG. 10 has a first location 509, at which the ablatable first material 1 is arranged. Additionally or alternatively, the end 506 of the material unit 502 of FIG. 10 has a second location 510, at which the ablatable second material 2 is arranged.

Figure 11:
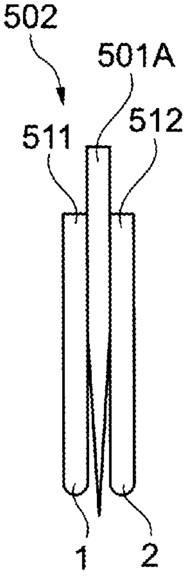
FIG. 11 shows a sixth embodiment of a material unit, which is arranged on a manipulator.

FIG. 11 shows a sixth embodiment of the material unit 502. A first material device 511 of the material unit 502 is arranged on a first side of a manipulator 501A. A second material device 512 of the material unit 502 is arranged on a second side of the manipulator 501A. The first material device 511 comprises the ablatable first material 1. By contrast, the second material device 512 comprises the ablatable second material 2. The first material device 511 is spatially separated from the second material device 512. Accordingly, the first material device 511 and the second material device 512 are not in contact.

Figure 12:
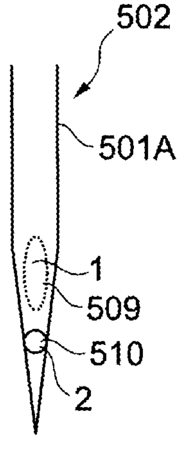
FIG. 12 shows an embodiment of a material unit in the form of a manipulator.

FIG. 12 shows an embodiment of the material unit 502. In this embodiment, the manipulator 501A itself is embodied as material unit 502. The manipulator 501A has a first location 509, at which the ablatable first material 1 is arranged. Additionally or alternatively, the manipulator 501A has a second location 510, at which the ablatable second material 2 is arranged.

Figure 13:
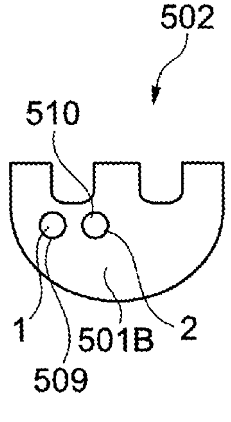
FIG. 13 shows an embodiment of a material unit in the form of a sample carrier.

FIG. 13 shows an embodiment of the material unit 502. In this embodiment, the sample carrier 501B itself is embodied as material unit 502. The sample carrier 501B has a first location 509, at which the ablatable first material 1 is arranged. Additionally or alternatively, the sample carrier 501B has a second location 510, at which the ablatable second material 2 is arranged.

The control unit 123 of the SEM 100 as per FIG. 1, of the combination apparatus 200 as per FIG. 2, and/or of the particle beam apparatus 400 as per FIG. 3 is embodied as a processor or comprises a processor. Loaded into the processor is a computer program product with a program code which, upon execution, carries out a method for operating the SEM 100 as per FIG. 1, the combination apparatus 200 as per FIG. 2, and/or the particle beam apparatus 400 as per FIG. 3.

Below, embodiments of the method according to the system described herein are explained in relation to the combination apparatus 200 as per FIG. 2. Corresponding statements apply in respect of the SEM 100 as per FIG. 1 and the particle beam apparatus 400 as per FIG. 3.

Figure 14:
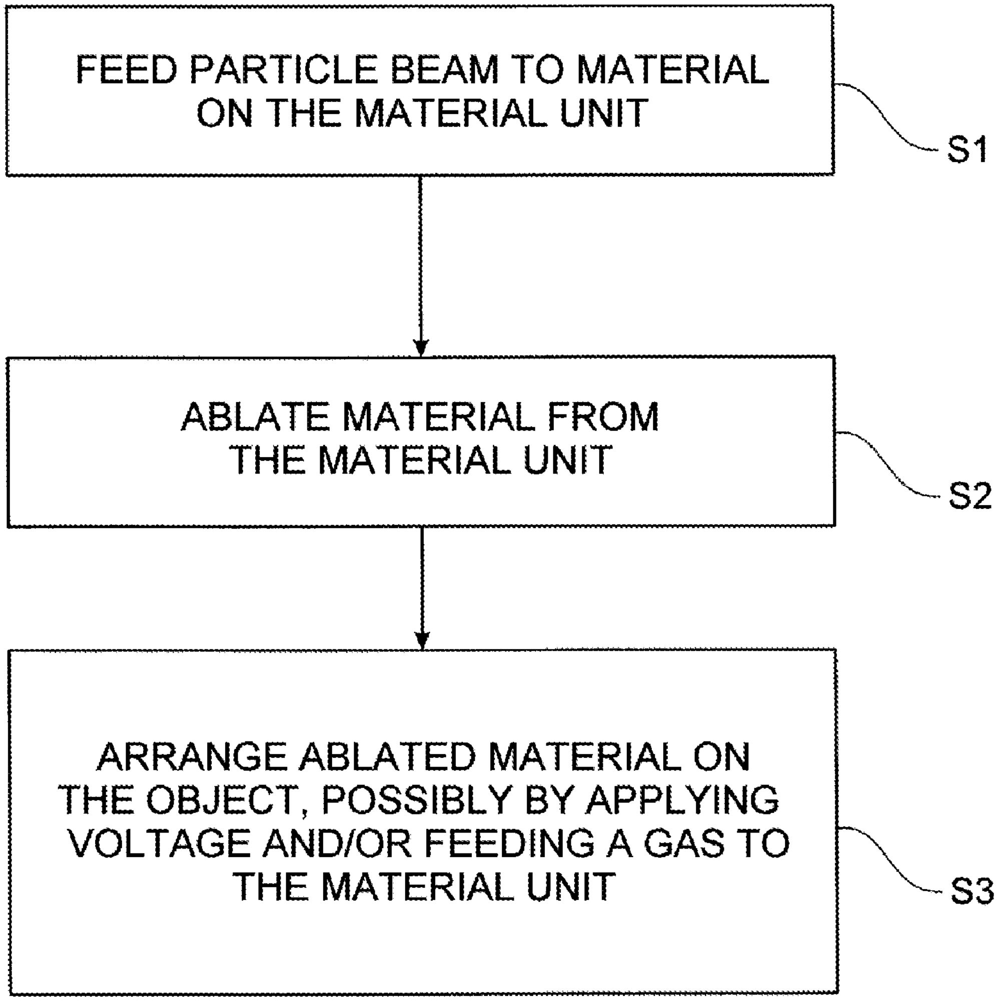
FIG. 14 shows a schematic illustration of the progress of a first embodiment of a method for ablating a material and for arranging the material on an object and/or on a structural unit.

FIG. 14 shows one embodiment of the method according to the system described herein. In a method step S1, the electron beam and/or the ion beam are/is guided to the ablatable material arranged on the material unit 502. This is illustrated schematically in FIG. 15. The electron beam and/or the ion beam are/is guided in the direction of the arrow A to the ablatable material 1 arranged on the material unit 502. By way of example, the material unit 502 has one of the configurations illustrated in FIGS. 6 to 10. By way of example, the electron beam is scanned over the surface of the ablatable material 1 on the material unit 502 by means of the scanning device 115 of the SEM 100. By way of example, the ion beam is scanned over the surface of the ablatable material 1 on the material unit 502 by means of the electrode arrangement 307, 308.

If the material unit 502 consists of a single ablatable material 1, the particle beam is guided to any location or to a selectable location on the material unit 502. The same applies if the material unit 502 consists of a mixture or an alloy of a plurality of ablatable materials, for example, of the ablatable first material 1 and of the ablatable second material 2.

As explained elsewhere herein, the material unit 502 can also be embodied as a carrier of the ablatable material 1. Then, the material unit 502 comprises the ablatable material 1 at a surface of the material unit 502, for example, and is formed from a material that differs from the ablatable material 1. Then, the particle beam is guided to the location on the surface of the material unit 502, at which the ablatable material 1 is arranged. If two ablatable materials are provided and if the material unit 502 has one of the embodiments of FIGS. 6 to 10, for example, then the particle beam is guided to the first location 509, at which the ablatable first material 1 is arranged, and/or to the second location 510, at which the ablatable second material 2 is arranged.

Figure 15:
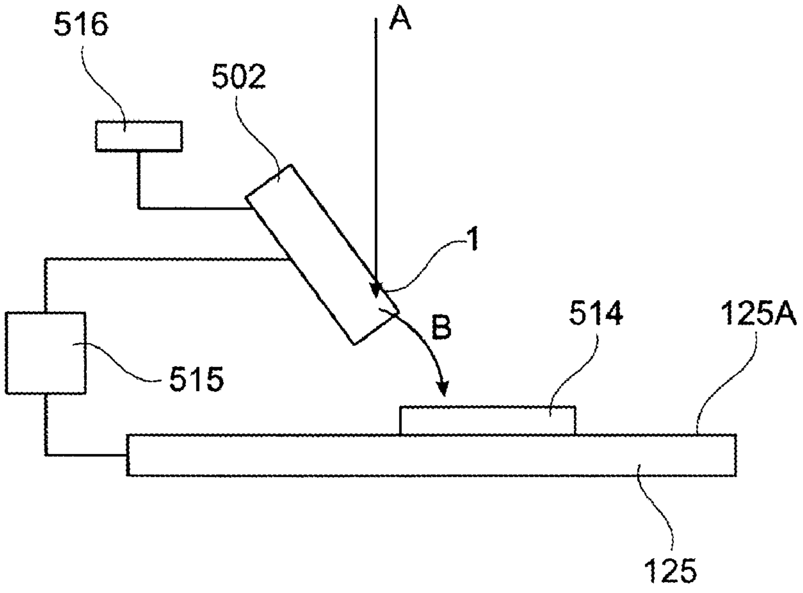
FIG. 15 shows a schematic illustration of a material unit and an object in a particle beam apparatus.

As illustrated schematically in FIG. 15, the ablatable material 1 is arranged on the material unit 502 at a distance from the object 125. Expressed differently, the ablatable material 1 on the material unit 502 is spaced apart from the object 125. In particular, provision is made for the ablatable material 1 on the material unit 502 and the object 125 not to be in contact. Accordingly, the distance between the ablatable material 1 on the material unit 502 and the object 125 is not 0 μm, but greater than 0 μm. By way of example, the ablatable material 1 on the material unit 502 has a distance of a few μm, for example, up to 20 μm, up to 10 μm, or up to 5 μm, from the location at which the subsequently ablated material 514 should be arranged on the surface of the object 125.

On account of the interaction of the particle beam with the ablatable material 1 arranged on the material unit 502, the ablatable material 1 is now ablated from the material unit 502 using the particle beam in a method step S2 as per FIG. 14. Expressed differently, there are interactions between the particle beam and the ablatable material 1 when the particle beam is fed to the ablatable material 1, in such a way that the ablatable material 1 is at least partly ablated from the material unit 502.

The material 514 ablated from the material unit 502 is now arranged on the object 125 in a method step S3 as per FIG. 14. By way of example, the ablated material 514 moves in the direction of a surface 125A of the object 125 in the direction of the arrow B as per FIG. 15. The ablated material 514 is deposited at a location in the form of a region on the surface 125A of the object 125. A layer of the ablated material 514 is formed on the surface 125A of the object 125. Accordingly, the ablated material 514 from the material unit 502 reaches the location on the surface 125A of the object 125 where the layer of the ablated material 514 should be applied to the object 125.

To accelerate and/or improve the deposition of the material 514 ablated from the material unit 502, provision is made in one embodiment of the system described herein for a first voltage to be applied between the material unit 502 and the object 125 using a first voltage supply unit 515. The voltage supply unit 515 is illustrated in FIG. 15. This has the following background: When feeding the particle beam to the ablatable material 1 on the material unit 502 at least some of the ablated material 514 is ionized. To be able to guide the ionized ablated material 514 well in the direction of the object 125, the first voltage is applied between the material unit 502 and the object 125. Then, the ionized ablated material 514 is guided from the material unit 502 to the object 125 at the location on the surface 125A of the object 125 at which the ablated material 514 is arranged.

In method step S3, a gas is conducted to the location on the material unit 502 at which the particle beam strikes the ablatable material 1 using the gas feed device 1000 in one embodiment of the system described herein. By way of example, water vapor is used as a gas. Supplying the gas increases the ionized proportion of the ablated material 514. This allows more ablated material 514 to be guided from the material unit 502 to the object 125 on account of the applied voltage and to be arranged there on the surface 125A of the object 125.

Figure 16:
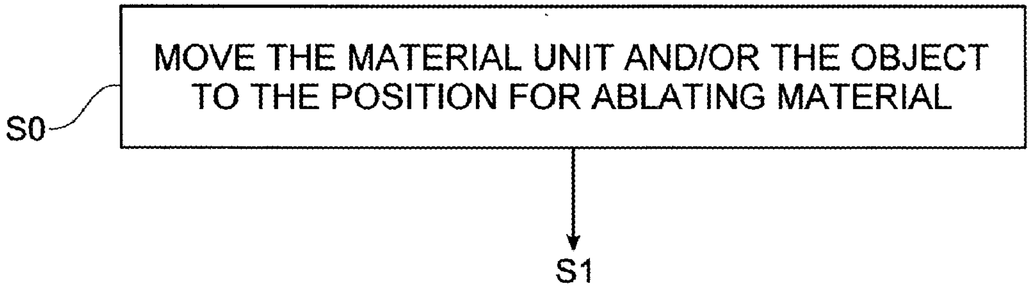
FIG. 16 shows a schematic illustration of the progress of a second embodiment of a method for ablating a material and for arranging the material on an object and/or on a structural unit.

FIG. 16 shows a method step S0, which is carried out in one embodiment of the system described herein before method step S1 of the method as per FIG. 14 is performed. In method step S0, the material unit 502 is moved relative to the object 125 in such a way that the material unit 502 is arranged at a distance from the object 125. To this end, use is made, for example, of a material unit movement device 516, which is illustrated schematically in FIG. 15 and by means of which the material unit 502 is moved. In addition or as an alternative thereto, the sample stage 122, on which the object 125 is arranged, is moved in order to obtain a desired arrangement of the material unit 502 relative to the object 125. The closer the material unit 502 is arranged to the object 125, the smaller the region on the surface 125A of the object 125 on which the ablated material 514 is arranged. By way of example, the material unit 502 has a distance of a few μm, for example, up to 20 μm, up to 10 μm, or up to 5 μm, from the location at which the ablated material 514 is arranged on the surface 125A of the object 125.

The material unit movement device 516 moves the material unit 502, for example, into a first position and/or into a second position. In the first position of the material unit 502, the particle beam is guided to the ablatable first material 1, for example. After moving the material unit 502 from the first position to the second position, the particle beam is guided to the ablatable second material 2. However, the invention is not restricted to a rotation from the first position to the second position. Rather, any movement, in particular any translational movement, which moves the material unit 502 from the first position to the second position is suitable and usable for the system described herein.

Figure 17:
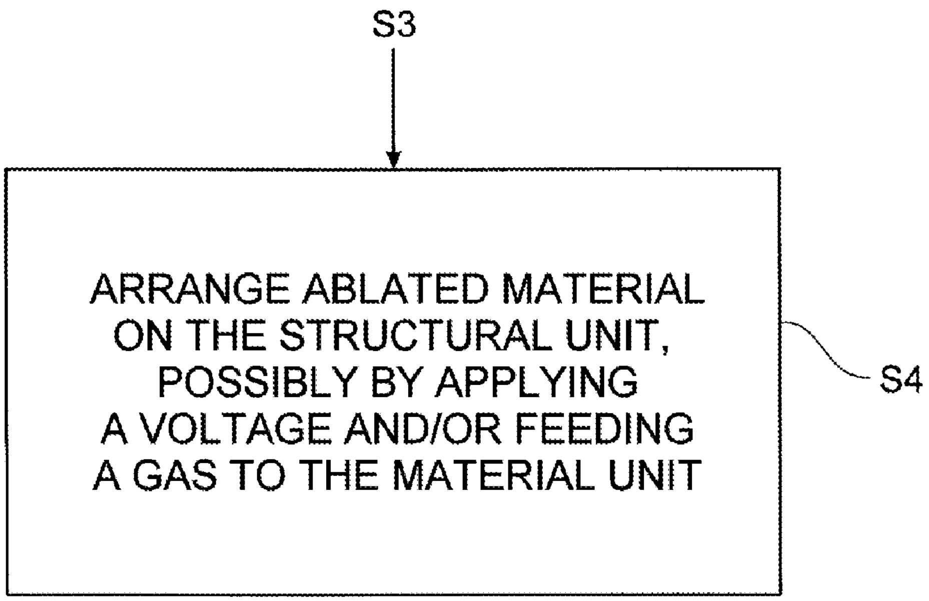
FIG. 17 shows a schematic illustration of the progress of a third embodiment of a method for ablating material and for arranging the material on an object and/or on a structural unit.

FIG. 17 shows a further embodiment of the method according to the system described herein. The embodiment of FIG. 17 is based on the embodiment of FIG. 14 or 16 and has the same method steps S1 to S3 or S0 to S3 like the embodiment of FIG. 14 or 16. In respect of the method steps S0 and S1 to S3, reference is made to the explanations provided elsewhere herein.

Figure 18:
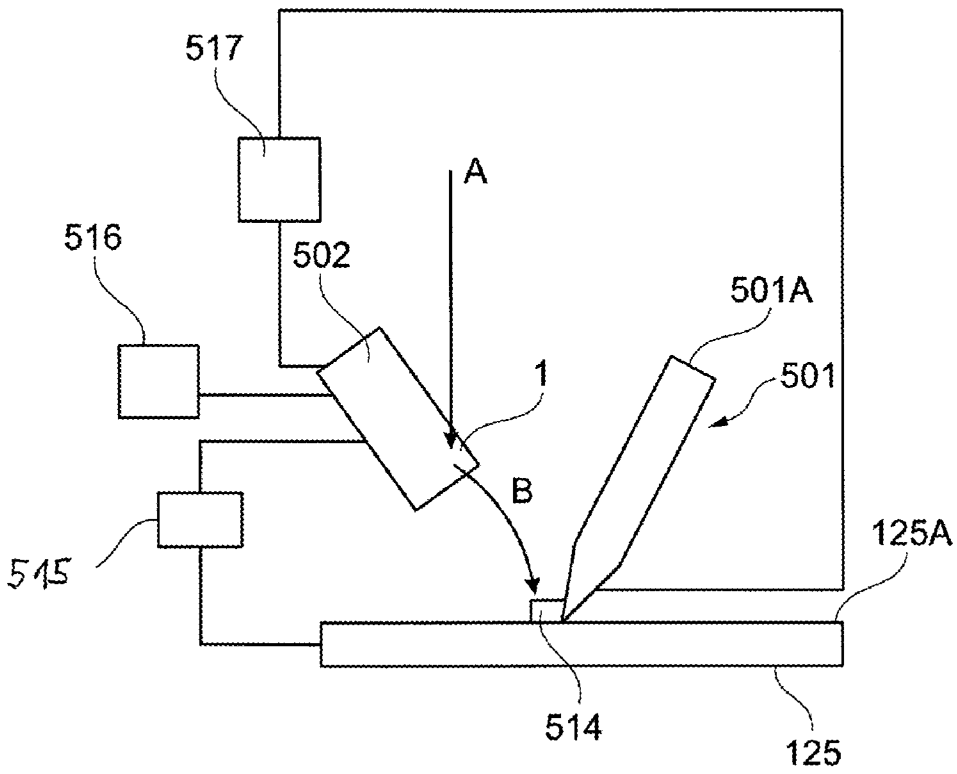
FIG. 18 shows a further schematic illustration of a material unit and an object in a particle beam apparatus.

In contrast to the embodiment of FIG. 14 or 16, the embodiment of FIG. 17 has the additional method step S4, which can be performed after or while method step S3 is carried out. FIG. 18 serves to explain the further method according to the system described herein as per FIG. 17. The schematic illustration of FIG. 18 is based on the schematic illustration of FIG. 15. Identical component parts are provided with identical reference signs.

The electron beam and/or the ion beam are/is guided in the direction of the arrow A to the ablatable material 1 arranged on the material unit 502. On account of the interaction of the particle beam with the ablatable material 1 arranged on the material unit 502, the ablatable material 1 is ablated from the material unit 502 using the particle beam. The material 514 ablated from the material unit 502 is arranged on the object 125. A layer of the ablated material 514 is formed on the surface 125A of the object 125. Accordingly, the ablated material 514 from the material unit 502 reaches the location on the surface 125A of the object 125 where the layer of the ablated material 514 should be applied to the object 125. Reference is made to the statements provided elsewhere herein with respect to a possible application of a voltage between the material unit 502 and the object 125 and in respect of possible feed of a gas. This can also be used in the embodiment explained here.

In the further embodiment of the method according to the system described herein, the material 514 ablated from the material unit 502 is now additionally arranged on the structural unit 501, for example, on the manipulator 501A, in method step S4. By way of example, the ablated material 514 moves both in the direction of the surface 125A of the object 125 and in the direction of the structural unit 501, in the direction of the arrow B as per FIG. 18. The material 514 ablated from the material unit 502 is deposited between the surface 125A of the object 125 and the structural unit 501 in such a way that the object 125 is securely connected to the structural unit 501.

To accelerate and/or improve the deposition of the material 514 ablated from the material unit 502, provision is made in one embodiment of the system described herein for a second voltage to be applied between the material unit 502 and the structural unit 501 using a second voltage supply unit 517. The second voltage supply unit 517 is illustrated in FIG. 18. The advantages of applying a voltage is explained elsewhere herein. Reference is made thereto.

In method step S4, a gas is also conducted to the location on the material unit 502 at which the particle beam strikes the ablatable material 1 using the gas feed device 1000 in one embodiment of the system described herein. By way of example, water vapor is used as a gas. As explained elsewhere herein, the supply of the gas increases the ionized proportion of the ablated material 514. Reference is made to the statements elsewhere herein with respect to the advantages.

Figure 19:
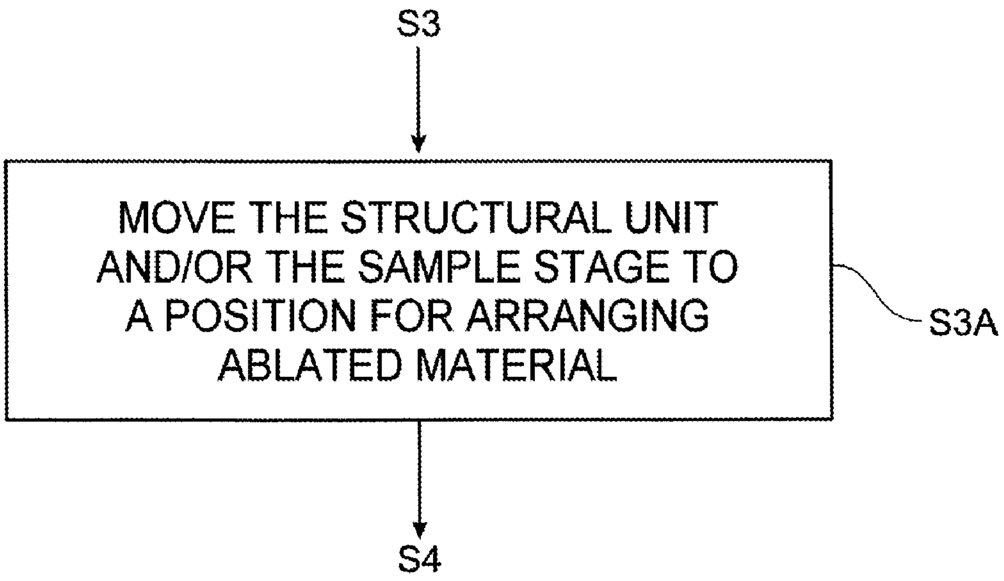
FIG. 19 shows a schematic illustration of the progress of a fourth embodiment of a method for ablating material and for arranging a material on an object and/or on a structural unit.

FIG. 19 shows a method step S3A, which is carried out in a further embodiment of the method according to the system described herein as per FIG. 17, for example, between the method steps S3 and S4. In method step S3A, the structural unit 501, for example, the manipulator 501A, is moved relative to the object 125 in such a way that the structural unit 501 is in contact with the object 125 or arranged at a distance from the object 125. By way of example, the structural unit 501 is moved using the structural unit movement device 513. In addition or as an alternative thereto, the sample stage 122, on which the object 125 is arranged, is moved in order to obtain a desired arrangement of the structural unit 501 relative to the object 125.

The further embodiment of the method according to the system described herein as per FIG. 17 and the schematic illustration in FIG. 18 serves, in particular, to fasten a part of the object 125 to the manipulator 501A or the sample carrier 501B by depositing the material 514 ablated from the material unit 502 both on the part of the object 125 and on the manipulator 501A or the sample carrier 501B. To this end, the part of the object 125 is connected to the manipulator 501A or the sample carrier 501B. At a connection point between firstly the part of the object 125 and secondly the manipulator 501A or the sample carrier 501B, the ablated material 514 is deposited in such a way that the part of the object 125 is securely connected to the manipulator 501A or the sample carrier 501B. If the part of the object 125 is connected to the manipulator 501A in this way, the part of the object 125 can be removed with the manipulator 501A from the object 125 after the part of the object 125 is separated from the object 125, for example, by using the particle beam, for example, the electron beam or the ion beam.

Figure 20:
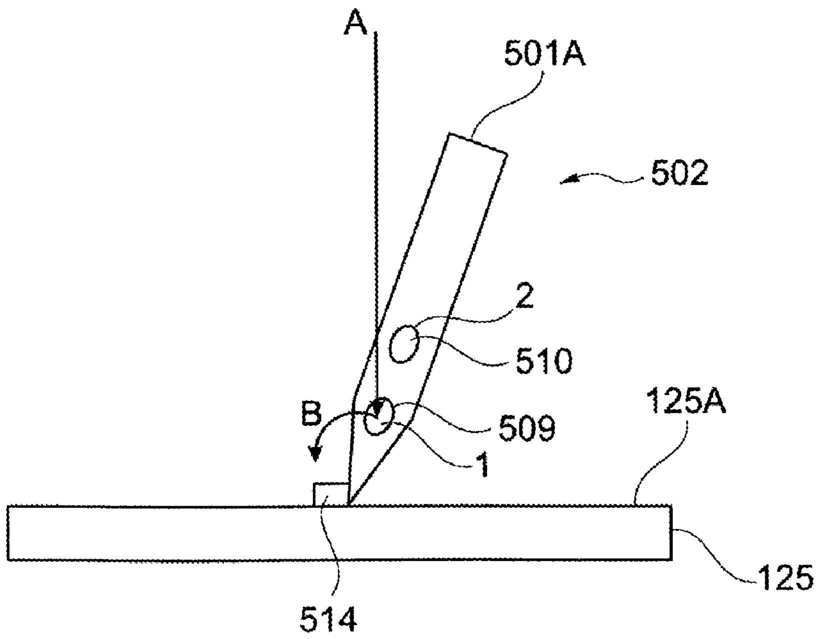
FIG. 20 shows a further schematic illustration of a material unit and an object in a particle beam apparatus.

FIG. 20 serves to explain a further use of the further method according to the system described herein as per FIG. 17. The schematic illustration of FIG. 20 is based on the schematic illustration of FIG. 18. Identical component parts are provided with identical reference signs. The material unit 502 in the form of the manipulator 501A, which is illustrated in FIG. 12, is used in the embodiment illustrated in FIG. 20. The electron beam and/or the ion beam are/is guided in the direction of the arrow A to the ablatable first material 1 arranged on the material unit 502 at the first location 509 or to the ablatable second material 2 arranged on the material unit 502 at the second location 510. On account of the interaction of the particle beam with the ablatable first material 1 arranged on the material unit 502, the ablatable first material 1 is ablated. In the case of the interaction of the particle beam with the ablatable second material 2 arranged on the material unit 502, the ablatable second material 2 is ablated from the material unit 502. The first material 514 or second material 514 ablated from the material unit 502 moves in the direction of the arrow B and is arranged on the object 125. A layer of the ablated first material 514 and/or second material 514 is formed on the surface 125A of the object 125. The layer is deposited between the manipulator 501A and the object 125 in such a way that the layer securely connects the manipulator 501A to the object 125. In this way, the object 125 is securely arranged on the manipulator 501A.

Figure 21:
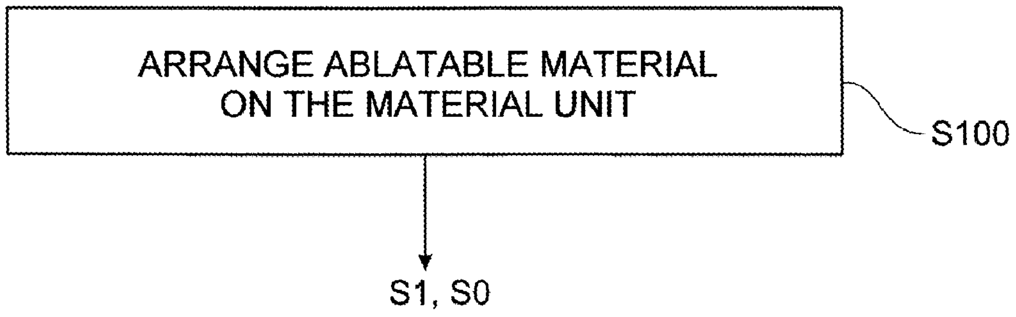
FIG. 21 shows a schematic illustration of the progress of a fifth embodiment of a method for ablating material and for arranging a material on an object and/or on a structural unit.

FIG. 21 shows a method step S100, which is carried out in one embodiment of the system described herein before method step S1 of the method as per FIG. 14 or method step S0 of the method as per FIG. 16 is performed. In method step S100, ablatable material is initially arranged on the material unit 502. By way of example, the ablatable material is applied to the material unit 502 using the particle beam in the form of the electron beam or the ion beam and using the gas feed device 1000. A precursor is admitted into the sample chamber 201 of the combination apparatus 200 by means of the gas feed device 1000. As a result of the interaction of the particle beam, for example, the ion beam, with the precursor, a layer of the ablatable material is deposited on the surface of the material unit 502. In this way, the material unit 502 is provided with the ablatable material which is then used in the further method according to the system described herein.

As mentioned elsewhere herein, the combination apparatus 200 comprises the secondary ion mass spectrometer 500, which is connected to the control unit 123. In all of the embodiments of the method according to the system described herein, the secondary ion mass spectrometer 500 is used to observe and examine the application of ablatable material on the material unit 502 and/or the ablation of the ablatable material from the material unit 502 and/or the arrangement of the ablated material on the object 125 and/or on the structural unit 501.

All embodiments of the system described herein have the advantages and effects already explained elsewhere herein, which are referred to here.

The features disclosed in the present description, in the drawings and in the claims may be essential for the realization of various embodiments of the system described herein, both individually and in arbitrary combinations. The invention is not restricted to the described embodiments. It may be varied within the scope of the claims and taking into account the knowledge of the relevant person skilled in the art.

The invention claimed is:

1. A method for ablating a plurality of materials from a material unit and for arranging the plurality of materials on an object arranged in a particle beam apparatus, comprising:

feeding a particle beam with charged particles onto the plurality of materials, wherein the plurality of materials is arranged on the material unit and/or wherein the material unit is formed from the plurality of materials, wherein the plurality of materials is ablatable from the material unit and wherein the plurality of materials is arranged on the material unit at a distance from the object;

ablating the ablatable plurality of materials arranged on the material unit from the material unit using the particle beam;

arranging the ablated plurality of materials on the object as at least one of: a mixture of the plurality of materials and an alloy of the plurality of materials; and examining and/or observing the ablated plurality of materials using a secondary ion mass spectrometer during ablation of the plurality of materials from the material unit using the particle beam and during arranging the ablated plurality of materials on the object.

2. The method as claimed in claim 1, further comprising at least one of the following steps:

(i) moving the material unit relative to the object using a material unit movement device, in such a way that the material unit is arranged at a distance from the object or contacts the object;

(ii) moving a sample stage on which the object is arranged, in such a way that the object is arranged at a distance from the material unit or the material unit contacts the object.

3. The method as claimed in claim 2, wherein the ablatable plurality of materials of the material unit includes an ablatable first material and an ablatable second material, wherein the particle beam is guided to the ablatable first material in a first position of the material unit, the material unit is moved relatively from the first position into a second position, and the particle beam is guided to the ablatable second material in the second position of the material unit.

4. The method as claimed in claim 3, further comprising at least one of the following steps:

(i) the material unit is moved from the first position to the second position using the material unit movement device;

(ii) the particle beam is moved using at least one deflection unit, in such a way that the particle beam is guided to the ablatable first or second material;

(iii) the material unit is rotated from the first position to the second position using the material unit movement device.

5. The method as claimed in claim 1, wherein a first voltage is applied between the material unit and the object for the purposes of arranging the ablated plurality of materials on the object.

6. The method as claimed in claim 1, wherein a first gas is guided by a first gas supply unit to a location of incidence of the particle beam on the ablatable plurality of materials at the material unit.

7. The method as claimed in claim 1, further comprising at least one of the following steps:

(i) the plurality of materials is applied to the material unit using the particle beam and a first gas feed device before the particle beam is fed to the ablatable plurality of materials;

(ii) the plurality of materials is applied to the material unit by condensation, wherein the material unit is cooled and/or has been cooled.

8. The method as claimed in claim 1, wherein a structural unit is embodied as a manipulator and/or as a sample carrier.

9. The method as claimed in claim 8, further comprising at least one of the following steps:

(i) moving the structural unit relative to the object using a structural unit movement device, in such a way that the structural unit contacts the object;

(ii) moving the structural unit relative to the object using the structural unit movement device, in such a way that the structural unit is arranged at a distance from the object;

(iii) moving a sample stage on which the object is arranged, in such a way that the structural unit contacts the object;

(iv) moving the sample stage on which the object is arranged, in such a way that the structural unit is arranged at a distance from the object.

10. The method as claimed in claim 8, wherein the structural unit includes the ablatable plurality of materials.

11. The method as claimed in claim 10, further comprising at least one of the following steps:

(i) an other ablatable material is applied to the structural unit using the particle beam and a second gas feed device before the particle beam is fed to the ablatable plurality of materials;

(ii) the other ablatable material is applied to the structural unit by condensation, wherein the structural unit is cooled and/or has been cooled.

12. The method as claimed in claim 8, wherein a second voltage is applied between the material unit and the structural unit for the purposes of arranging the ablated plurality of materials on the structural unit.

13. The method as claimed in claim 12, wherein a second gas is guided by a second gas supply unit to a location of incidence of the particle beam on the ablatable plurality of materials at the material unit.

14. The method as claimed in claim 1, wherein the ablatable plurality of materials of the material unit includes an ablatable first material, wherein the material unit includes an ablatable second material, wherein the ablatable second material is arranged at a distance from the object and wherein the method further comprises the following steps:

feeding the particle beam to the ablatable first and second material on the material unit, ablating the ablatable first and second material arranged on the material unit from the material unit using the particle beam; and arranging the ablated first and second material on the object.

15. The method as claimed in claim 14, wherein the ablated first or second material is arranged on the object and on a structural unit to connect the object to the structural unit.

16. The method as claimed in claim 14, further comprising one of the following features:

(i) using a first material device and a second material device as the material unit, wherein the first material device includes the ablatable first material and wherein the second material device includes the ablatable second material;

(ii) using a first material device and a second material device as the material unit, wherein the first material device includes the ablatable first material, wherein the second material device includes the ablatable second material, and wherein the first material device is spatially separated from the second material device;

(iii) using a first material device and a second material device as the material unit, wherein the first material device includes the ablatable first material, wherein the second material device includes the ablatable second material, and wherein the first material device is spatially completely separated from the second material device, in such a way that the first material device and the second material device are not in contact.

17. The method as claimed in claim 1, wherein the ablated plurality of materials is formed on a surface of the object between a structural unit and the object to securely connect the object to the structural unit.

18. The method as claimed in claim 1, wherein the particle beam is a focused particle beam.

19. The method as claimed in claim 1, wherein examining and/or observing the ablated plurality of materials using the secondary ion mass spectrometer is performed by examining a surface of the material unit.

* * * * *